(12) United States Patent
Mizutani

(10) Patent No.: US 6,320,658 B1
(45) Date of Patent: Nov. 20, 2001

(54) APPARATUS AND METHOD FOR DETECTING THE POSITION OF A SURFACE TO BE EXAMINED, EXPOSURE APPARATUS EQUIPPED WITH THE DETECTING APPARATUS AND METHOD OF PRODUCING THE EXPOSURE APPARATUS, AND METHOD OF PRODUCING DEVICES USING THE EXPOSURE APPARATUS

(75) Inventor: Hideo Mizutani, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/455,773

(22) Filed: Dec. 7, 1999

Related U.S. Application Data

(63) Continuation of application No. PCT/JP98/02534, filed on Jun. 9, 1998.

(30) Foreign Application Priority Data

Jun. 9, 1997 (JP) .................................................... 9-164929
Jul. 9, 1997 (JP) .................................................... 9-183311

(51) Int. Cl.⁷ .................................................... G01B 11/00
(52) U.S. Cl. ...................... 356/399; 356/401; 250/559.3; 250/548
(58) Field of Search .................................. 356/375, 401, 356/399, 400, 484–490; 250/548, 559.3

(56) References Cited

U.S. PATENT DOCUMENTS

| 5,191,200 | | 3/1993 | Van Der Werf et al. . | |
|---|---|---|---|---|
| 5,323,016 | * | 6/1994 | Yamada et al. | 250/561 |
| 5,416,562 | | 5/1995 | Ota et al. . | |
| 5,602,399 | | 2/1997 | Mizutani . | |
| 5,602,644 | * | 2/1997 | Ota | 356/363 |
| 5,633,721 | | 5/1997 | Mizutani . | |
| 5,726,758 | * | 3/1998 | Hasegawa et al. | 356/401 |
| 5,796,483 | * | 8/1998 | Nakayama | 356/349 |
| 5,859,439 | * | 1/1999 | Nam et al. | 250/548 |
| 5,955,739 | * | 9/1999 | Kawashima | 250/548 |
| 6,040,909 | * | 3/2000 | Hasegawa et al. | 356/375 |
| 6,130,751 | * | 10/2000 | Haginiwa et al. | 356/401 |

FOREIGN PATENT DOCUMENTS

| 5-129182 | 5/1993 | (JP) . |
|---|---|---|
| 6-36992 | 2/1994 | (JP) . |
| 6-97045 | 4/1994 | (JP) . |
| 6-188172 | 7/1994 | (JP) . |
| 7-153670 | 6/1995 | (JP) . |
| 7-221013 | 8/1995 | (JP) . |
| A-9-5055 | 1/1997 | (JP) . |
| 9-115807 | 5/1997 | (JP) . |
| 10-50579 | 2/1998 | (JP) . |

* cited by examiner

Primary Examiner—Frank G. Font
Assistant Examiner—Layla Lauchman
(74) Attorney, Agent, or Firm—Oliff & Berridge, PLC

(57) ABSTRACT

The present invention relates to a detecting apparatus capable of detecting the position of a surface to be examined at higher accuracy and speed. Particularly, the detecting apparatus of the present invention allows a slit image, which is tilted relative to a base pattern on the surface of a substrate, to be applied to the surface of the substrate and its reflection on the surface to be re-imaged and recorded as a two-dimensional image on an image pick-up device. In particular, a row of imaging elements of the image pick-up device aligned in one dimension are arranged with its direction extending at an angle to the lengthwise direction of the two-dimensional image of the slit pattern reflection. Also, the two-dimensional image of the slit pattern reflection is defocused along the lengthwise direction by the action of a specific optics thus to average data of the optical characteristics on the surface of the substrate. An exposure apparatus according to the present invention is also provided capable of detecting the position of a surface to be examined along the normal to the surface from data of one dimensional image picked up by an image pick-up device and may also use two beams of light which interfere with each other for the purpose.

19 Claims, 12 Drawing Sheets

APPARATUS AND METHOD FOR DETECTING THE POSITION OF A SURFACE TO BE EXAMINED, EXPOSURE APPARATUS EQUIPPED WITH THE DETECTING APPARATUS AND METHOD OF PRODUCING THE EXPOSURE APPARATUS, AND METHOD OF PRODUCING DEVICES USING THE EXPOSURE APPARATUS

This is a Continuation of PCT/JP98/02534 filed Jun. 9, 1998. The entire disclosure of the prior application is hereby incorporated by reference herein in its entirety.

TECHNICAL FIELD

The present invention relates to an apparatus and a method of detecting the position of a surface, an exposure apparatus equipped with the detecting apparatus and a method of producing the exposure apparatus, and a method of producing devices using the exposure apparatus and particularly to a detecting technique suitable for use in e.g. a focusing position detecting system (AF sensor) of lithography for producing semiconductor devices or liquid crystal displays. In this specification, semiconductor devices, liquid crystal displays, thin-film magnetic heads, and charge coupled devices (CCDs) are called generally as "devices".

BACKGROUND ART

An exposure apparatus conventionally used for transferring a pattern of circuit form applied on a reticle acting as a mask via an optical projecting system onto a photosensitive substrate (namely, a wafer or a glass plate coated with e.g. a photoresist and referred to as a wafer hereinafter) is of a reduced projection type exposure apparatus of step-and-repeat type (a stepper). More recently, a reduced projection exposure apparatus of step-and-scan type is employed for transferring a large-sized mask pattern to a wafer at higher definition without increasing the size of an optical projecting system.

Also, because the optical projecting system in such a type of the projection exposure apparatus is intended to increase the resolution and thus has a higher numerical aperture and hence a smaller depth-of-focus, it includes an auto-focusing (AF) system for setting (focusing) an imaging surface of the optical projecting system with the surface of the wafer within a permissive range of depth-of-focus of the projecting system and an auto-leveling (AL) system for adjusting the tilting of the exposure surface of the wafer. It is thus necessary in either the AF and the AL system to accurately measure the surface position at more than one point in the exposure area of the wafer along the optical axis of the optical projecting system.

Particularly, the AF system comprises a focusing point detecting system of oblique beam incident type for directing a beam of non-photosensitive illumination light to e.g. a photoresist at an angle to the optical axis of the projecting system and receiving its reflection to determine the level of defocusing of a projected image on the wafer surface (referred to as an AF sensor), and a stage system responsive to the result of measurement from the AF sensor for controlling the focusing location (along the optical axis in the optical projecting system) on the wafer. As an AF sensor of a conventional type, the following technologies are known.

Firstly, as disclosed in Japanese Patent Laid-open Publication (Hei)7-221013, a sensor of the first conventional type for detecting the position in two dimensions is provided in which a slit pattern of light is obliquely projected onto the effective area of a surface to be examined and re-imaged on a two-dimensional image pick-up device. More specifically, a two-dimensional change in the slit pattern is measured and detected as a displacement of the surface to be examined. For avoiding unwanted effects of an existing base pattern projected on the surface to be examined, the slit pattern is directed at an angle to the existing base pattern on the surface to be examined.

Secondly, as disclosed in Japanese Patent Laid-open Publication (Hei)5-129182 (U.S. Pat. No. 5,633,721), a sensor of the second conventional type is provided similarly in which a slit pattern of light is obliquely directed to the two dimensional area of a surface to be examined and re-imaged on a two-dimensional image pick-up device such as a CCD to measure a range (here, along the normal line) of the two-dimensional position of the surface to be examined from a lateral shift of each portion of the re-imaged pattern. As this type of the sensor allows the slit pattern of light to be obliquely projected to the surface to be examined, the imaging surface conjugate with the surface to be examined possibly has a dithered surface significantly tilted from the perpendicular to the optical axis. Accordingly, if the imaging surface is positioned parallel to the dithered surface, the luminous intensity of a projected image on the projection surface will be declined. For compensation, the second conventional sensor employs a diffraction grating or the like to change the dithered surface to a surface vertical to the optical axis.

Thirdly, as disclosed in Japanese Patent Laid-open Publication (Hei)6-97045, a sensor of the third conventional type, similar to the second conventional sensor, permits a slit pattern of light to be projected on the surface to be examined and then its projection to be re-imaged on a light receiver slit so that a portion of the projection passing through the receiver slit is measured as detected light. In order to detect a lateral displacement of the re-imaged projection, the re-imaged projection is oscillated by an oscillating mirror. Also, the third conventional sensor uses a prism for shifting the dithered surface to a surface vertical to the optical axis.

Fourthly, as disclosed in Japanese Patent Laid-open Publication (Hei)6-188172 (U.S. Pat. No. 5,191,200), a sensor of the fourth conventional type is provided in which for detecting the position of a surface to be examined at one single point in the center of an exposure field in the projecting system, a pattern of first diffraction grating is projected to the surface to be examined and its projection is then re-imaged on a second diffraction grating so that a portion of the re-imaged projection passing through the second grating is received. Accordingly, the fourth conventional sensor is substantially equivalent to the third conventional sensor, in which the slit pattern is replaced by a diffraction grating pattern. In the fourth conventional sensor, the reflection of light on the surface to be examined is received via a polarizer, a birefringent element (a Savart plate), a polarizing modulator, and an optical detector for detecting a lateral displacement of the image of a pattern resulting from variation in the surface to be examined.

SUMMARY OF THE INVENTION

The inventors have found the following problems in the prior art through a series of tests on the prior arts. More specifically, the prior art is intended to project a slit pattern or a diffraction grating pattern of light on the surface to be examined and measure a lateral displacement of a re-imaged image of the projected pattern for detecting the position of the surface (particularly, the surface position along the normal line of the surface to be examined).

In the first conventional sensor, a plurality of exposing actions (multi-exposure) are commonly carried out on the substrate such as a wafer. Accordingly, a directional pattern as a base pattern on the wafer, for example, a vertical and horizontal line-and-space pattern is formed when the detection of the surface position is performed at the second and higher exposing action. This results in non-uniformity of the surface characteristics including brightness and darkness from the line and space, and effects the accuracy of the detection.

Also in the first conventional sensor, a pattern of e.g. slit form is projected at an angle to the direction along which the base pattern extends for eliminating unwanted effects of the base pattern when the detection of the position of a surface of e.g. a semiconductor wafer where the base or directional circuit pattern is formed. While the sensor of this type can be reduced in the size by increasing the freedom of the incident angle of light of a pattern to be projected, it needs to shift every scanned data (the image data of each line) on its two-dimensional image pick-up device in the scanning direction along the tilted pattern to have an average since the pattern is projected at an angle to the surface to be examined. Moreover, the two-dimensional image pick-up device such as a CCD has such a drawback that its scanning is time-consuming thus increasing the time required for the detection.

In the second conventional sensor, as a lateral displacement of the projected pattern re-imaged on the image pick-up device is directly measured, the projected pattern has to be re-imaged at a higher magnification for having a desired level of resolution. This requires increasing the overall size of the sensor. In addition, the size of the image pick-up device limits the size of the detecting area. The more the number of pixels of the image pick-up device increases, the longer the time required for signal processing is. Therefore, it is very difficult to decrease the time required for the detection.

In the third conventional sensor, while a desired level of the detection accuracy is ensured with the use of a comparatively low magnification, the pattern has to be projected at a considerable accuracy to the receiver slit. However, when the surface position is measured at two or more points in an enlarged detecting area, it is necessary to match two or more of the patterns with the receiver slit hence making adjustment of the optical system very difficult. Also, the oscillating mirror is used thus hardly enabling the detection to be carried out rapidly same as the second conventional sensor.

In comparison, the fourth conventional sensor employs the polarizing modulator thus allowing relatively rapid action of the detection. However, variation in the polarization due to conditions of the reflection on the surface to be examined may decline the accuracy of the detection. Also, it is necessary to substantially coincide the pitch in the projection of a first diffraction grating pattern with the pitch in a second grating pattern, hence making adjustment of the optical system difficult.

Furthermore, the fourth conventional sensor takes no account of dithering of the surface to be examined, hence while being capable of detecting the surface position at one measuring point, failing to handle two or more of the measuring points. If the measuring points are two or more, the detection may produce an error.

In the step-and-scan type of the projection exposure apparatus which has been made popular recently, the detecting speed of its AF sensor is determined through detecting (pre-reading) the focusing position (the surface position) at a plurality of the measuring points in a pre-reading area which is located along the scanning direction before the exposure area of a slit form on the wafer, and in response to a result of the detection, controlling the surface of the wafer in the exposure area to be coincided with the imaging surface of the optical projecting system. For increasing the scanning speed to improve the through-put in the exposure process during focusing action on the focusing position being pre-read, it is essential to increase the speed of detecting the focusing position.

It is thus an object of the present invention to provide an apparatus and a method for detecting the position of a surface to be examined at higher accuracy and speed with the use of a compact arrangement, an exposure apparatus equipped with the detecting apparatus and a method of producing the exposure apparatus, and a method of producing devices with the exposure apparatus.

A first embodiment of the detecting apparatus according to the present invention is a device suitable for an AF sensor and the like in a lithography process for manufacturing semiconductor devices or liquid crystal display element, and particularly a compact device capable of detecting at higher accuracy and speed the position of a surface of a wafer on which a base pattern having one direction or two directions orthogonal to each other is formed, and hardly receiving unwanted effects of the base pattern.

More specifically, the first embodiment of the present invention is an apparatus for detecting the position of a surface to be examined on which a pattern extending in a first direction is provided, comprising: a projection optical system for forming on the surface to be examined a first image which extends in a second direction intersecting the first direction on the surface; an imaging optical system for re-imaging the first image on a particular surface; an image pick-up device having an imaging surface thereof coincided with the particular surface and at least one element array arranged with light receiver elements aligned in a fourth direction intersecting a third direction which corresponds to the lengthwise direction of a second image which is to be re-imaged first image on the imaging surface; and an optics for defocusing the second image along the third direction on the imaging surface.

The image pick-up device may be a one-dimensional image pick-up device. Also, a two-dimensional image pick-up device may be used with one line of the imaging element arrays activated for implementing the detecting method of the present invention, whereby the detection of a surface to be examined will be performed at higher accuracy and speed.

In the detecting apparatus of the first embodiment, the (first) direction of the pattern formed on the surface to be examined, for example, of the horizontal and vertical lines of a line-and-space pattern formed on the exposure surface of a semiconductor wafer, is arranged not parallel to the lengthwise direction (the second direction) of the slit pattern (the first image). Also, the array of the imaging elements of the one-dimensional image pick-up device (or one scanning line of a two-dimensional image pick-up device) which extends in one dimension (along the fourth direction) is arranged not parallel nor orthogonal to the lengthwise direction (the third direction) of the re-imaged slit pattern image (the second image). Accordingly, the first image can fall over the base pattern having the direction and applied on the surface of the substrate with not biasing to local characteristics but covering the entire optical characteristics of interest.

The optics is arranged to defocus the second image along the third direction on the imaging surface (while light collecting or dispersing components of the incident light received on the imaging surface along the lengthwise direction of the second image), whereby data relevant to non-uniformity of the optical characteristics on the surface to be examined in the second image re-imaged on the imaging surface of the one-dimensional image pick-up device is average thus controlling unwanted effects of the non-uniformity on the surface.

The optics may defocus along the third direction the second image which preferably is imaged along a fifth direction orthogonal to the third direction on the imaging surface. More particularly, the optics may be a lens adapted of which the power of refraction is different between two directions orthogonal to each other. For example, a cylindrical lens or a toric lens may be used which is arranged with its generatrix extending along the lengthwise direction of the second image or the direction orthogonal to the lengthwise direction. In particular, the toric lens may be implemented as a part of a relay lens for focusing the slit image on the imaging surface of the one-dimensional image pick-up device.

On the other hand, as realized in the detecting apparatus of the first embodiment, a detecting method is provided comprising: a first step for providing an object having the surface to be examined; a second step for providing on the surface to be examined a first image which extends in a second direction intersecting the first direction; a third step for re-imaging the first image on the imaging surface of an image pick-up device; and a fourth step for detecting the position of the surface to be examined from the position of a second image provided on the imaging surface of the image pick-up device.

At the third step, particularly, the second image which is to be re-imaged on the imaging surface may be defocused along a third direction which corresponds to the lengthwise direction of the second image while the third direction intersects a fourth direction which corresponds to a row of light receiver elements (an element array) of the image pick-up device aligned in one dimension. The second image may preferably be defocused along the third direction while imaged along a fifth direction orthogonal to the third direction on the imaging surface.

Moreover, the detecting apparatus of the first embodiment may be used as an FA sensor in a one-shot exposure apparatus or a scanning type exposure apparatus such as a step-and-repeat type. That is to say, such an exposure apparatus is provided comprising: a first stage (wafer stage) for moving a substrate which is being placed on the first stage; a second stage (mask stage) for moving the mask which has a particular pattern and is being placed on the second stage; an optical projecting system for projecting the particular pattern on the mask to the substrate; the detecting apparatus of the first embodiment; and a control system for driving and controlling the first stage in accordance with the position of the surface to be examined of the substrate detected by the detecting apparatus to carry the substrate to a desired position.

A method of producing the exposure apparatus equipped with the detecting apparatus of the first embodiment is provided comprising the steps of: providing the first stage (wafer stage) for moving the substrate which is being placed on the first stage; providing the second stage (mask stage) for moving the mask which has the particular pattern and is being placed on the second stage; providing the optical projecting system for projecting the particular pattern on the mask to the substrate; and providing the detecting apparatus defined in claim 1 for detecting the position of a surface to be examined of the substrate.

The exposure apparatus equipped with the detecting apparatus may be used for manufacturing semiconductor devices, liquid crystal displays, thin-film magnetic heads, charge coupled devices (CCD), or any other devices. Namely, the method of producing such devices comprises the steps of: detecting the position of a surface to be examined of the substrate placed on the first stage with the detecting apparatus; driving and controlling the first stage so that the imaging surface of the optical projecting system coincides with the surface to be examined of the substrate; and transferring an image of the particular pattern on the mask placed on the second stage via the optical projecting system onto the substrate. This method permits unwanted effects of the base pattern on the substrate to be effectively controlled while detecting the position of the surface, hence ensuring the focusing action at higher accuracy and speed and improving the throughput of the production.

In addition, the detecting apparatus according to the present invention provides not only detecting the position of a surface to be examined at higher accuracy and speed but also increasing the resolution of the detection of the surface without increasing the size of the optical system for detection, while detecting a profile of the position of the surface at a plurality of detection areas (extensive detection areas) with ease. The exposure apparatus equipped with the above detecting apparatus is capable of coinciding the surface of the substrate such as a wafer with the imaging surface of the optical projecting system at higher accuracy and speed. Also the method of producing devices with the exposure apparatus permits any form of circuit pattern to be formed at higher resolution.

As a second embodiment, a detecting apparatus according to the present invention is provided for detecting the position of a surface to be examined along a height direction of the surface orthogonal to the surface with the use of two beams of light which interfere with each other. More specifically, the detecting apparatus of the second embodiment comprises: a projection optical system for projecting two beams of light which interfere with each other so that they are converged adjacent to the surface to be examined; a collecting optical system for light collecting reflections of the two beams from the surface; a received beam combining system for generating a first interference light from the two reflected beams; a signal detecting system for receiving the first interference light from the received beam combining system and subjecting it to optoelectric conversion; and a control system responsive to detection signals of for detecting the position of the surface along the height direction from a lateral displacement of interference fringes generated by the two reflected beams calculated from detection signals of the signal detecting system and their reference signals (reference beat signals).

The two beams of light projecting from the projection optical system may be (homodyne) beams which are different in phase but identical in frequency or (heterodyne) beams having a frequency difference.

In particular, a displacement of the surface to be examined along the height direction appears as a lateral displacement of interference fringes generated between reflections of the two incident beams reflected on the surface. In the detecting apparatus of the second embodiment, the phase of the beat signals generated by optoelectric conversion of the interference light from the received beam combining system with the signal detecting system is compared with the phase of the reference beat signals to measure the lateral displacement of interference fringes for detecting the position (along the normal line) of the surface to be examined. The reference beat signals may be generated from drive signals for acoustooptic devices which produces heterodyne beam in the projection optical system. Also, the use of heterodyne interference between the two beams permits the detection of a surface to be performed at higher accuracy and speed.

The surface involving the two beams of light projected from the projection optical system to the surface to be examined may preferably be tilted relative to an incident surface involving the optical axis of the projection optical system and the optical axis of the collecting optical system. This is intended for avoiding unwanted effects of the circuit pattern, e.g. a line pattern (extending in particular directions), applied on the surface to be examined during the detection process.

In the detecting apparatus of the second embodiment, the received beam combining system may preferably include a grating pattern provided on a plane, which satisfies the requirement of shine-proof with the surface to be examined, for diffracting the two reflected beams in substantially the same direction. It may more preferably be arranged that a beam combining surface (having the grating pattern) is provided across the light path in the received beam combining system for combining the two reflected beams in substantially one axial direction while a beam splitting surface (having the grating pattern) is provided across the light path in the projection optical system for separating portions of the two reflected beams. Simultaneously, it may be arranged that the surface to be examined, the beam combining plane, and the beam splitting surface are located so that the requirement of shine-proof is satisfied between the surface and the beam combining surface and also between the surface and the beam splitting surface (each two being conjugate with each other). The use of the grating pattern allows interference light to be generated in a rather compact arrangement by splitting or combining the two beams at substantially coaxial relationship.

The detecting apparatus of the second embodiment may include a reference signal generating system for receiving the second interference light generated between two beams split from the two incident beams and generating the reference beat signals by optoelectric conversion of the second interference light. As described previously, when the pattern of diffraction grating is disposed adjacent to the conjugate surface in the projection optical system with the surface to be examined, a pair of diffracted outputs released in the same direction from the diffracted grating pattern generate the interference light which is then optoelectrically converted to the reference beat signals. The use of the reference beat signals allows a relative displacement of the surface from the projection optical system to be detected at higher accuracy.

The detecting apparatus of the second embodiment may preferably be modified in that the signal detecting system is adapted for splitting the first interference light from the received beam combining system into a plurality of beams corresponding to the number of detection areas on the surface to be examined and equipped with a plurality of optoelectric detectors allocated to the number of the split beams. Simultaneously, the control system may preferably be adapted for detecting separately the position of the detection areas along the height direction of the surface from detection signals of the optoelectric detectors and their reference signals. Because the interference light is split into a group of beams, the detection of the range of the surface position can be performed at a corresponding number of detection areas (extensive areas) without increasing the side of the optical system.

On the other hand, a detecting method realized in the detecting apparatus of the second embodiment is provided comprising the steps of: projecting two (homodyne or heterodyne) beams of light which interfere with each other so that they are converged adjacent to the surface to be examined; light collecting reflections of the two beams from the surface; generating a first interference light from the two reflected beams; optoelectrically converting the first interference light to detection signals containing data about the first interference light; and the position of the surface along the height direction from a lateral displacement of interference fringes generated between the two reflected beams which is obtained from the detection signals and their reference (beat) signals.

For avoiding unwanted effects on the surface to be examined in the detection, the two beams of light may preferably be projected on the surface to be examined while a surface involving the two beams is tilted relative to an incident surface orthogonal to the surface. Also, for obtaining the interference light in a compact arrangement, the two beams may preferably be diffracted in substantially the same direction by a diffraction grating pattern provided across a (beam combining) surface which satisfies the requirement of shine-proof with the surface to be examined. For generating the reference beat signals, wanted portions of the two beams may preferably be separated by a diffraction grating pattern provided across a (beam splitting) surface which satisfies the requirement of shine-proof with the surface to be examined. Interference light generated between the two separated portions is then optoelectrically converted to the reference beat signals.

For detecting the position at extensive areas in a compact arrangement, the detecting method may further comprise: splitting the first interference light into a plurality of beams corresponding to the number of detection areas on the surface to be examined; optoelectrically converting the split beams to detection signals containing data about the split beams; and detecting separately the position of the detection areas of the surface along the height direction of the surface from the detection signals and their reference signals.

The detecting apparatus of the second embodiment like the first embodiment can also be applied to an exposure apparatus. An exposure apparatus equipped with the detecting apparatus of the second embodiment is provided comprising: an optical projecting system for projecting a particular pattern provided in a mask on a substrate; a substrate stage capable of adjusting the position of the substrate along the optical axis of the optical projecting system with the substrate placed on the substrate stage; a mask stage for moving the mask with the mask on it synchronizing with the wafer stage; the detecting apparatus of the second embodiment for detecting the position of a surface of the substrate along the optical axis of the optical projecting system; and a main control system for driving and controlling the substrate stage in response to data of the position of the surface of the substrate detected by the detecting apparatus so that the surface of the substrate coincides with an imaging surface of the optical projecting system.

In the exposure apparatus, the main control system may preferably be adapted for driving and controlling both the mask stage and the substrate stage along the optical axis of the optical projecting system so that the mask and the substrate are scanned in synchronism about the optical projecting system in the exposure action, directing the detecting apparatus of the second embodiment to detect along the optical axis of the optical projecting system the position of a detection area on the substrate which is located in front of an exposure area on the substrate along the scanning direction, and driving and controlling the substrate stage in response to results of the detection from the detecting apparatus so that the surface of the substrate and the imaging surface of the optical projecting system coincide with each other. In other words, the coinciding the surface of a substrate with the imaging surface of the optical projecting system may be performed using data of pre-reading which is generated by pre-reading with the detecting apparatus the position of the surface to be examined at a pre-reading area of the surface located in front of an exposure area in the optical projecting system. This arrangement is equivalent to the detecting apparatus of the second embodiment applied as a pre-reading sensor to a scanning projection exposure apparatus such as step-and-scan type.

A method of producing the exposure apparatus equipped with the detecting apparatus of the second embodiment is provided comprising the steps of: providing an optical projecting system for projecting a particular pattern provided in a mask on a substrate; providing at least a wafer stage capable of adjusting the position of the substrate along the optical axis of the optical projecting system with the substrate placed on the substrate stage; providing a mask stage for moving the mask which is being placed on the mask stage; and providing the detecting apparatus of the second embodiment for detecting the position of a surface of the substrate along the optical axis of the optical projecting system.

The exposure apparatus equipped with the detecting apparatus of the second embodiment is also capable of producing semiconductor devices, liquid crystal displays, thin-film magnetic heads, charge coupled devices (CCD), and other devices. Namely, a method of producing such devices comprises the steps of: detecting the position of a surface of the substrate placed on the wafer stage along the optical axis of the optical projecting system with the detecting apparatus of the second embodiment; driving and controlling the wafer stage in response to data of the position of the surface of the substrate detected by the detecting apparatus so that the surface of the substrate and the imaging surface of the optical projecting system coincide with each other; and transferring the particular pattern of the mask placed on the mask stage via the optical projecting system to the substrate. This producing method allows the pattern on the mask to be projected on the substrate at higher resolution in its coincided state, hence improving the accuracy of line width control over a circuit pattern which is finally achieved.

BEST MODE FOR CARRYING OUT THE INVENTION

Embodiments of an apparatus and a method for the detection, an exposure apparatus equipped with the detecting apparatus, a method of producing the exposure apparatus, and a method of producing devices using the exposure apparatus according to the present invention will be described referring to the accompanying drawings. Like components are denoted by like numerals throughout the drawings and repeat of the description will be avoided.

Figure 1:
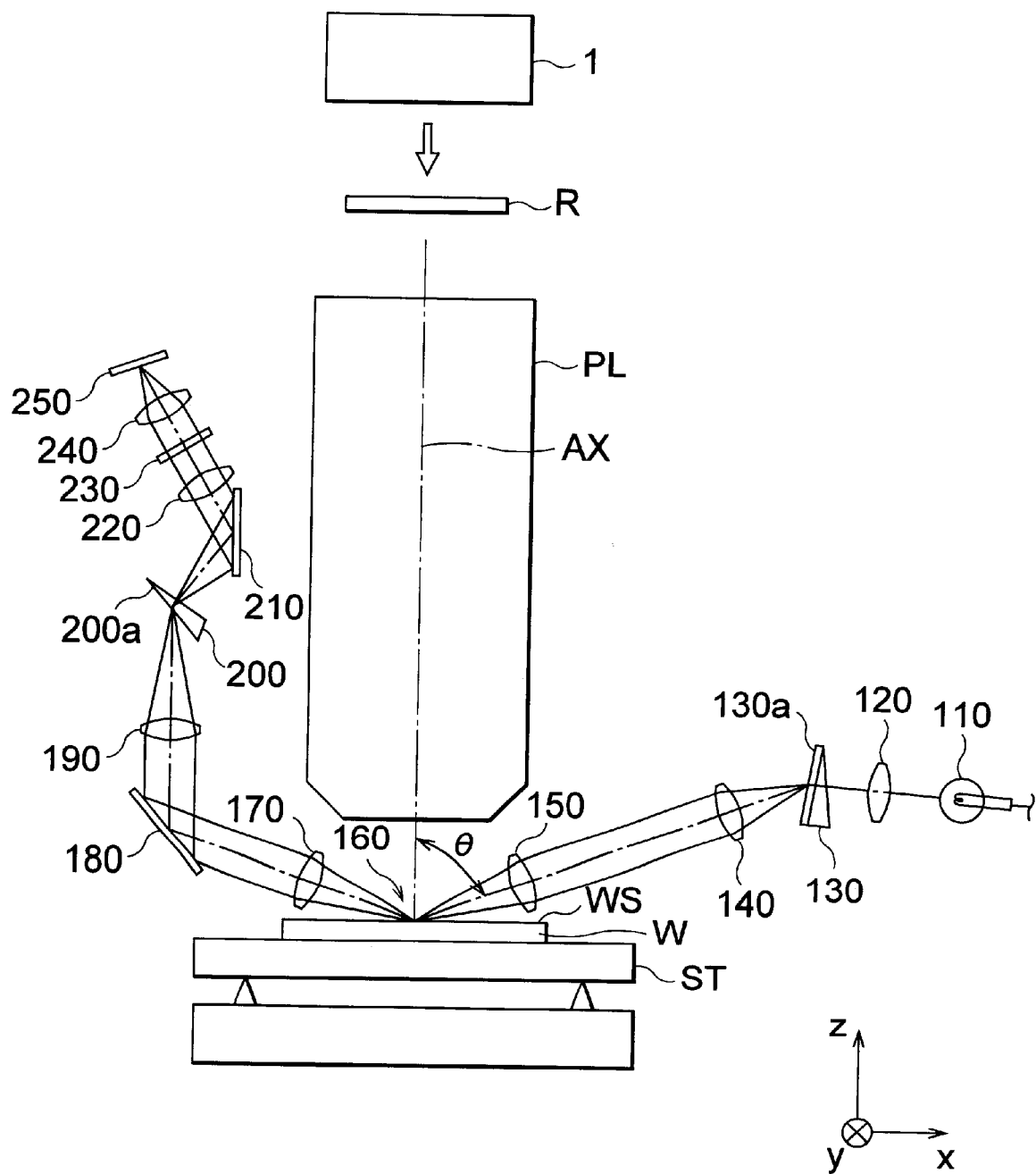
FIG. 1 is a view showing a schematic arrangement of a projection exposure apparatus equipped with a detecting apparatus of a first embodiment according to the present invention.

First, FIG. 1 illustrates a schematic arrangement of a projection exposure apparatus equipped with a first embodiment of the detecting apparatus of the present invention. The exposure apparatus shown in FIG. 1 includes an optical illuminating system 1, a reticle R having a circuit pattern to be transferred, an optical projecting system PL, and a wafer stage ST on which a photosensitive substrate such as a wafer is placed, which are aligned in this order along the optical axis AX of the optical projecting system PL. The reticle R and the (exposure) surface WS of a wafer W placed on the wafer stage ST are conjugate with each other about the optical projecting system PL. In the exposure apparatus, the circuit pattern on the reticle R is illuminated by the optical illuminating system 1 and projected by the optical projecting system PL to the exposure surface WS for exposure.

For transferring the circuit pattern of the reticle R to the exposure surface WS at a desired condition, it is necessary to set the exposure surface WS of the wafer W within a permissive range of depth-of-focus at the imaging surface in the optical projecting system PL. For the purpose, the apparatus for detecting the position of the exposure surface WS is disposed between the optical projecting system PL and the wafer W.

Referring to FIG. 1, a construction of the detecting apparatus of the first embodiment is explained. As shown, a condenser lens 120 and a deflector prism 130 are aligned across a light path extending from a light source 110 such as a halogen lamp or a light emitting diode to the exposure surface WS. The deflector prism 130 has a stripe pattern 130a provided on a side thereof reverse to the condenser lens 130, which comprises light transmission and blocking portions extending in one lengthwise direction and rowed alternately at equal intervals of a pitch. This transmission type pattern may be replaced by a reflection type diffraction grating or a magnification reflection type grating pattern comprising reflection and non-reflection portions rowed alternately. The pattern is not limited to a stripe but may have one single slit.

A light collecting lens 140 and a projection objective lens 150 which both constitute a projection optical system of the detecting apparatus are aligned in this order between the pattern 130a and the wafer W. In the first embodiment, illumination from the pattern 130a is directed at an incident angle θ (about 70 to 80 degrees) to the exposure surface WS of the wafer W which is the surface to be examined. The pattern 130a of the prism 130 is located relative to the exposure surface WS so that the requirement for shine-proof on the projection optics 140 and 150 is satisfied. More specifically, an image of the pattern 130a is focused by the projection optics 140 and 150 on an area where the intersection between the optical axis AX and the exposure surface WS exists. The projection optics 140 and 150 form a two-side telecentric system.

The illumination is then reflected on the exposure surface WS and directed to a light collecting optical system which comprises a light collecting objective lens 170, a light collecting lens 190, and a mirror 180 disposed between the two lenses. The mirror 180 is provided for deflecting and causing the optical axis of the light collecting optical system to extend parallel to the optical axis AX of the optical projecting system PL in order to make the optical arrangement compact.

A dithering compensation prism 200 is arranged behind the light collecting optics 170 and 190, which has an incident surface 200a thereof arranged conjugate with the exposure surface WS about the light collecting optics 170 and 190 with the exposure surface WS coinciding with the imaging surface of the optical projecting system PL. The incident side 200a and the exposure surface WS are arranged so that the requirement for shine-proof on the light collecting optics 170 and 190 is satisfied. The light collecting optics 170 and 190 form a two-side telecentric system.

Also, a mirror 210, a first relay lens 220, a second relay lens 240, and an image pick-up device 250 which has a plurality of imaging elements 250a arranged in one dimension on an imaging side thereof are aligned in this order on a side of the incident surface 200a reverse to the light collecting lens 190. The mirror 210 is not a must-item in this optical system but is provided for deflecting the optical axis to make the overall optical arrangement compact. The first relay lens 220 and the second relay lens 240 form a two-side telecentric system.

A cylindrical lens 230 (See FIG. 4A) is provided between the first relay lens 220 and the second relay lens 240. The cylindrical lens 230 is arranged so that its generatrix or line involving no power of refraction extends in a (detecting) direction which is orthogonal to the lengthwise direction of the slit pattern focused on the one-dimensionally arranged imaging elements 250a which will be explained later.

When an image of the pattern 130a is projected on the exposure surface WS, its reflection is re-imaged by the above system on the imaging surface of the image pick-up device 250 which acts as a detecting sensor. The detecting apparatus of the first embodiment is thus designed for receiving the image of the pattern 130a which may be varied by upward and downward movements of the wafer W (vertically of the exposure surface WS) and detecting a displacement along the optical axis AX of the optical projecting system PL of the exposure surface WS which is the surface to be examined through examining the received image.

Figure 2A:
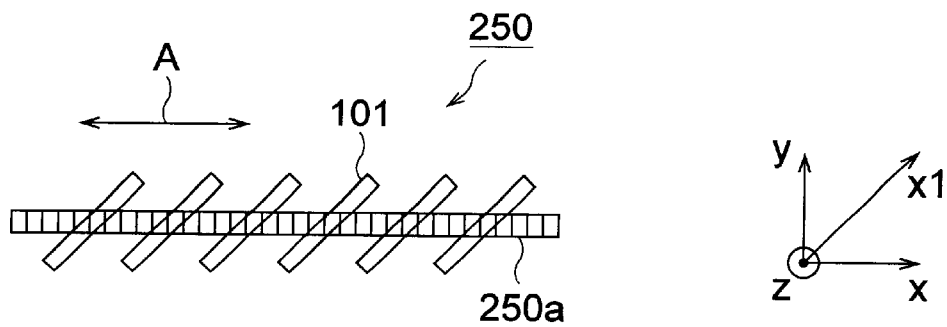
FIG. 2A is a plane view showing the positional relationship between imaging elements on the imaging surface of a one-dimensional image pick-up device and a slit image imaged on the imaging elements and FIG. 2B is a plane view of a base pattern having directions and provided on the surface to be examined on a substrate.
Figure 2B:
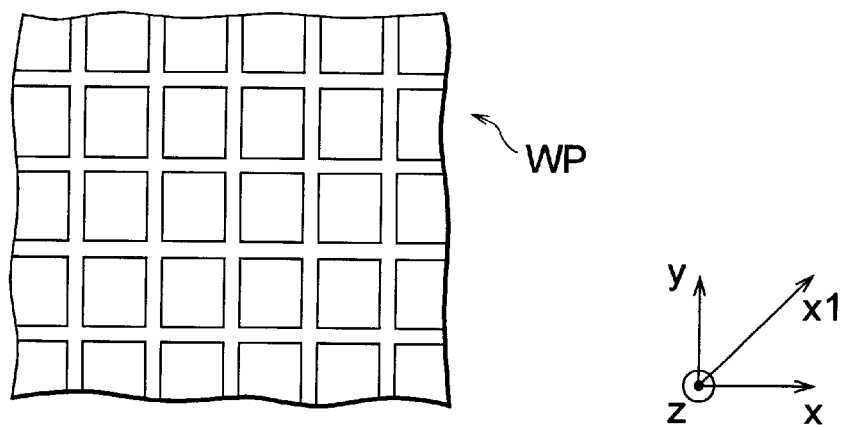

It is now assumed that the exposure surface WS receives an IC pattern WP comprising blocks defined by lines and spaces such as shown in FIG. 2B. The X and Y axes of the orthogonal XY coordinate on the exposure surface WS are assigned to the vertical and horizontal lines of the pattern and the incident surface is set parallel to the X axis.

In the illumination system of the detecting apparatus, a slit pattern of the pattern 130a is projected at an angle to the exposure surface WS so that its lengthwise direction on the exposure surface WS is not parallel to or orthogonal to the sides of each block of the IC pattern, i.e. the lengthwise direction does not corresponds to the X and Y axes. For example, the slit pattern is projected so that its lengthwise direction extends parallel to an axis X1 which has an origin common with the X axis and extends at an angle α to the X axis (See FIG. 2B).

A projection of the slit pattern 103a generated on the exposure surface WS is re-imaged by the optics 170, 190, 200, 210, 220, 230, and 140 on the one-dimensionally arranged imaging elements (a one-dimensional CCD) 250a of the image pick-up device 250.

FIG. 2A illustrates the positional relationship on the imaging surface between the one-dimensionally arranged imaging elements 250a of the CCD and the projection image 101 of the slit pattern. Also, an XY coordinate is provided on the imaging surface to correspond to the XY coordinate on the exposure surface WS. The scanning direction A of the one-dimensional image pick-up device 250 (along a row of the imaging elements 250a) extends parallel to the X axis. In other words, the scanning direction A along the CCD elements 250a (and the X axis) is parallel or perpendicular to the sides of each block of the IC pattern.

Accordingly, the projection image 101 of the slit pattern 130a falls at the angle α to the scanning direction on the CCD elements 250a. Although the angle α in FIG. 2A is 45 degrees which is most preferable as not parallel to the significant direction of the pattern, it is not limited to 45 degrees but may be greater than zero and smaller than 90 degrees, preferably ranging from 30 to 60 degrees.

Figure 3:
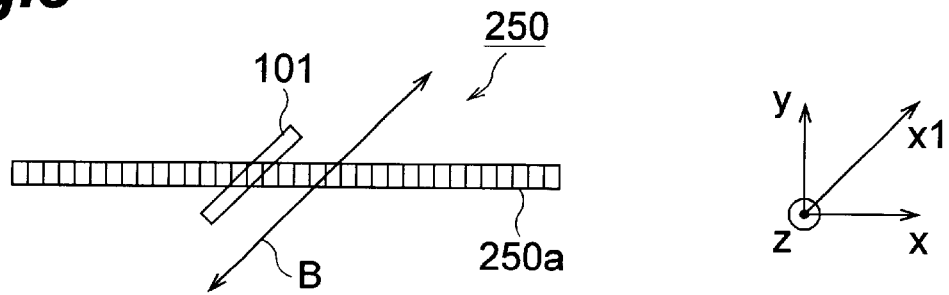
FIG. 3 is a plane view showing the relationship between imaging elements of a one-dimension image pick-up device, a slit image imaged on the imaging elements, and the direction of refraction on a cylindrical lens.

As shown in FIG. 3, the direction B of the cylindrical lens 230 involving the power of refraction is set extending along the lengthwise direction of the image 101 of the tilted slit pattern so that the image 101 is received clear in its (detecting) widthwise direction but not in its lengthwise direction.

In this manner, the received image used for detecting the position with the one-dimensional image pick-up device 250 (or one line of a two-dimensional image pick-up device) is compressed in the non-detecting direction or a direction vertical to the row (along the scanning direction) of the imaging elements 250a, hence providing the effect of averaging and the increase of light intensity.

While the incident surface 200a and the imaging surface of the image pick-up device 250 are arranged conjugate with each other about the first and second relay lenses as described with the exposure apparatus shown in FIG. 1, they are conjugate along the generatrix of the cylindrical lens 230 or the detecting direction for the slit image 101 of the slit pattern. As no conjugation is established in the directions other than the detecting direction, the image along the other directions is hence seen unclear.

The action of the cylindrical lens 230 causes the IC pattern image to be received unclear by the CCD elements 250a and recognized as a longer image than the pitch in the slit image 101 of the projecting pattern. Accordingly, while a displacement is detected from examining the slit image 101 of the projecting pattern, adverse effects of the IC pattern will be minimized.

More particularly, when the pitch in the projecting pattern of the slit image 101 is regarded as a spatial frequency to calculate a displacement from phase of the spatial frequency, it is different from that of the IC or base pattern and hence is hardly effected by the same.

Figure 4A:
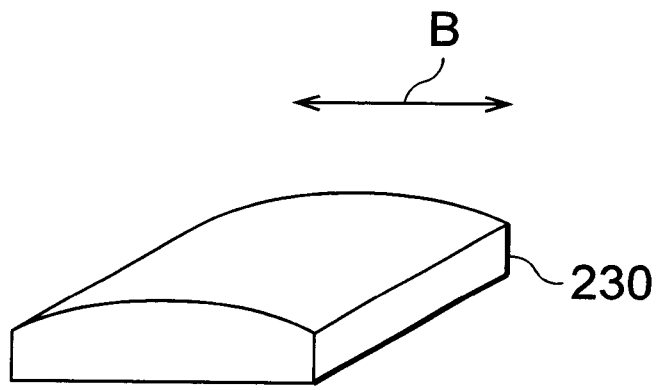
FIG. 4A is a perspective view of an example of the cylindrical lens and FIG. 4B is a perspective view of a toric lens.
Figure 4B:
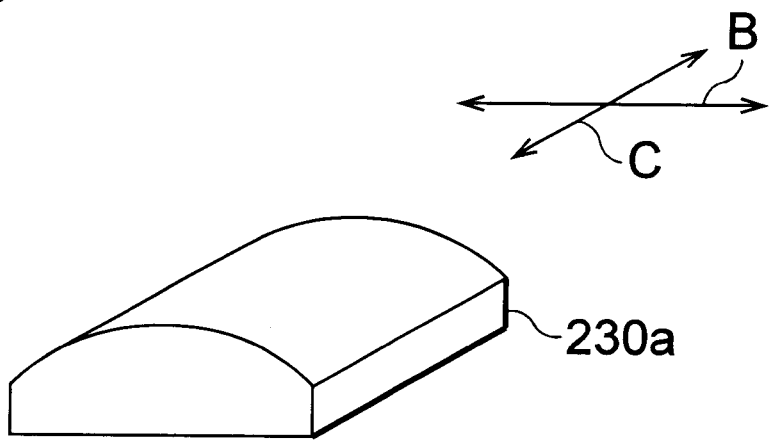

Although the optical element in the first embodiment for making the re-imaged image unclear along its lengthwise direction is a cylindrical lens such as shown in FIG. 4A, it may be of any type which can converge or disperse a flux of light along the lengthwise direction of the slit pattern, for example, a toric lens of which the power of refraction is different between two directions B and C may be used as shown in FIG. 4B. In that case, it is possible to replace either the first or second relay lens with a specific toric lens which has the same power of refraction as of the relay lens imposed along the direction C and thus eliminate one of the two relay lenses. The power of refraction along the direction B is arranged equal to that of the cylindrical lens to defocus the image of the slit pattern.

When the cylindrical lens is used, it is oriented so that its generatrix involving no power of refraction extends at a right angle to the lengthwise direction of the slit pattern of the image. It is also possible to align the generatrix with the lengthwise direction of the slit image. In this case, the cylindrical lens is disposed as replacing the first or second relay lens while its power of refraction is set equal to that of the replaced relay lens so that the slit pattern is focused along the detecting direction or the direction orthogonal to the lengthwise direction on the imaging surface. Accordingly, the image of the slit pattern is seen unclear along its lengthwise direction as its flux of light is dispersed.

Figure 5:
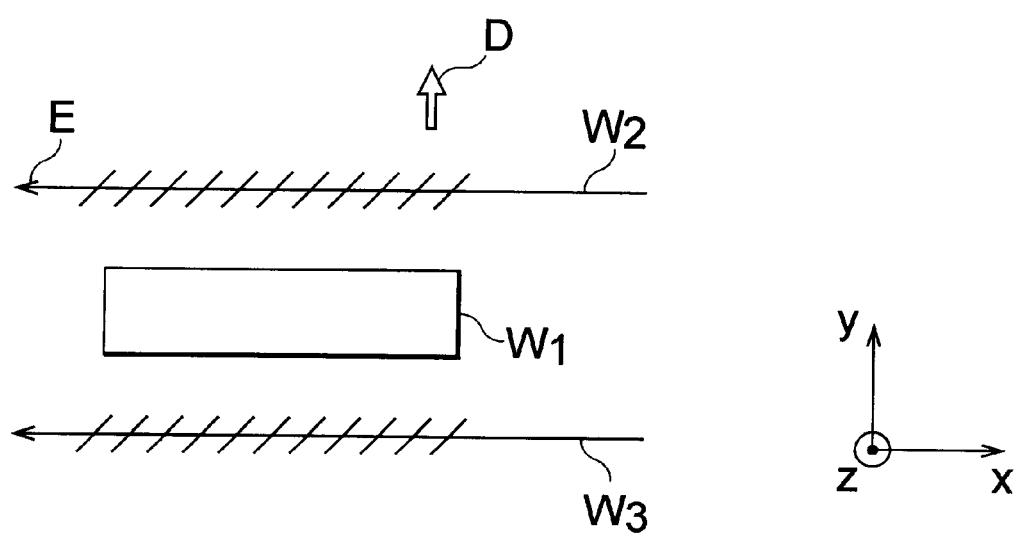
FIG. 5 is a plane view showing the relationship between an exposure area on the surface and the location and direction of an incident light.

Now, the exposure area, the incident position of light to be detected, and the incident angle on the exposure surface WS which is the surface to be examined will be described referring to FIG. 5. FIG. 5 illustrates a scanning type of the exposure apparatus having an exposure area W1 of a rectangular or slit form. The term, scanning, means an operation for synchronously moving a wafer W and a reticle R. The scanning direction D extends along a direction of movement of the exposure area W1 (with detecting lights W2 and W3) on the wafer W. More specifically, the exposure area W1 is scanned in the direction orthogonal to the lengthwise direction of the slit.

As with the scanning direction D, the two detecting lights W2 and W3 are applied before and after the exposure area W1 and in parallel with the long sides of the exposure area W1. The two lights are applied for corresponding to two, forward and backward, directions used for pre-reading during the scanning. Each of the two lights is received by the detecting apparatus of the first embodiment shown in FIG. 1. The relationship between the pre-reading position and the exposure area W1 is determined so that the exposure area W1 follows the pre-reading position on the exposure surface WS. For example in FIG. 5, as the scanning direction D extends upwardly of the figure, the pre-reading position W2 above the exposure area W1 is used.

As the detecting light is applied along its incident direction E parallel to the long sides of the exposure area W1, the detection point for focusing comes adjacent to the exposure area W1 thus allowing the focusing at a higher accuracy.

Since the detection position is spaced from the exposure area W1, vignetting across the detection light for focusing will be avoided with the actuating distance of the optical projecting system PL (the distance along the optical axis AX between the optical projecting system PL and the exposure surface WS) set as small as e.g. less than 1 mm.

As mentioned above, although the one-dimensional image pick-up device in the first embodiment is a CCD image pick-up device, any other appropriate devices may be used including a MOS image pick-up device, an image tube, an image die-sector, an MCP (micro channel plate), a mirror-scanning system, and a scanning system with acoustooptic devices.

As set forth above, the generatrix of the cylindrical lens (along a direction involving no power of refraction) is arranged parallel to the incident surface and the row of the imaging elements of the one-directional image pick-up device, hence allowing the flux of the detection light to be minimized in the cross section of the optical axis. For separating the projection of the slit pattern from the base pattern having a directivity, the lengthwise direction of the slit pattern is tilted to the significant direction of the base pattern. The projection of the slit pattern is then re-imaged on the imaging surface of the one-dimensional image pick-up device with its lengthwise direction extending at an angle to the row of the imaging elements. Since the base pattern is parallel or perpendicular to the row of the imaging elements of the image pick-up device, convergence or dispersion of the flux of light along the lengthwise direction of the slit pattern provides averaging of the light thus eliminating adverse effects of the base pattern. For convergence or dispersion, the optical element such as a cylindrical lens or a toric lens, of which the power of refraction is different between the generatrix and its orthogonal direction, is used so that the re-imaged image is generated clear along the widthwise direction of the slit pattern and unclear along the lengthwise direction of he same. Thereby, the optical characteristics on the surface to be examined can be averaged by the base pattern.

In the first embodiment, the one-dimensional image pick-up device is used which minimizes the cross section of a flux of light along the incident direction hence contributing to the minimum size of the detector optical system. Also, the imaging surface having dithering is arranged substantially in one dimension thus permitting the detector optical system to be adjusted with much ease.

Moreover, a detecting method performed by the detecting apparatus of the first embodiment comprises placing the substrate or a semiconductor wafer, on which a line and space pattern is formed, on the wafer stage of the projection exposure apparatus and directing light for detection at an angle to the exposure surface of the substrate to project a slit pattern on the exposure surface. A reflection of the slit pattern on the exposure surface is then collected and re-imaged on the imaging surface of the one-dimensional image pick-up device. By examining a re-imaged image of the slit pattern with the one-dimensional image pick-up device, the position of the exposure surface along the optical axis of the light collecting can be detected.

In particular, while the light for detection is directed at an angle to the exposure surface to project a slit pattern on the exposure surface, the significant direction of the line and space pattern or a pattern having a directivity formed on the exposure surface is oriented not parallel to the lengthwise direction of the slit pattern projected to the exposure surface.

Also, while the reflection of the slit pattern on the exposure surface is collected and re-imaged on the imaging surface of the one-dimensional image pick-up device, the lengthwise direction of the slit image of the re-imaged image is oriented not parallel and not orthogonal, e.g. at an angle of 45 degrees, to the row of the imaging elements of the one-dimensional image pick-up device. At the time, the reflection of the slit pattern is diffracted so that the slit pattern re-imaged on the imaging surface is received clear in the direction orthogonal to the lengthwise direction and unclear in the lengthwise direction. For diffraction of the reflection of light, the cylindrical lens or the toric lens is used. However, the same effect of diffraction may be achieved using a convex or concave mirror.

Further, a method of producing semiconductor devices with the exposure apparatus shown in FIG. 1 is provided comprising detecting the position of the exposure surface of a wafer in relation to the imaging surface of the optical projecting system to coincide the exposure surface with the imaging surface of the light collecting, and projecting a pattern of the original by the optical projecting system to the exposure surface for exposure. In this method, non-uniformity of the optical characteristics on the exposure surface caused by the base pattern is averaged and its adverse effect will be controlled. Also, as the position of the surface of a wafer is detected precisely and quickly, the throughput in the semiconductor device manufacturing will be improved.

A second embodiment of a detecting apparatus and an exposure apparatus equipped with the second embodiment according to the present invention will now be described referring to the relevant drawings. While the detecting apparatus of the second embodiment may be applied to either a step-and-repeat type or a step-and-scan type of the projection exposure apparatus, its description is made as an AF sensor (a focusing point detecting system) in a step-and-scan type projection exposure apparatus. A basic construction of the exposure apparatus (excluding the AF sensor of the second embodiment) is substantially identical to that of the exposure apparatus which has been described with the detecting apparatus of the first embodiment.

Figure 6:
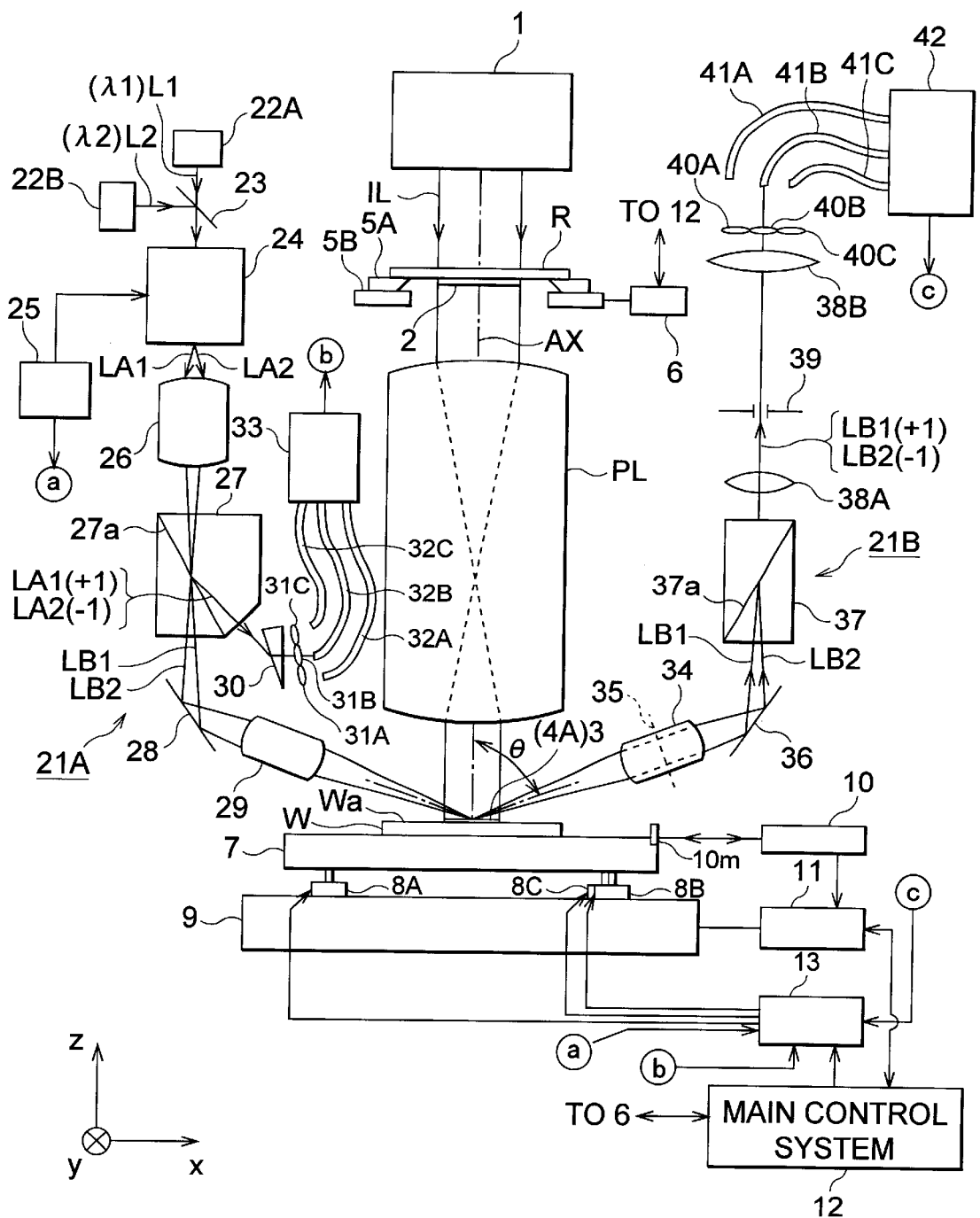
FIG. 6 is a view showing a schematic arrangement of a step-and-scan type projection exposure apparatus equipped with a detecting apparatus of a second embodiment according to the present invention.

FIG. 6 is a schematic view showing the structure of the projection exposure apparatus equipped with the detecting apparatus of the second embodiment of the present invention. In the exposure apparatus shown in FIG. 1, an optical illuminating system 1 comprises an exposure light source for emitting light for exposure, a fly-eye lens for averaging a profile of illumination of the exposure light, an illumination aperture stop, relay lens optics, a field-of-view stop (a reticle blind), and condenser lens optics and emits exposure light IL to illuminate an illumination area 2 of a four-sided shape of a pattern in a reticle R. The exposure light IL may be selected from excimer laser such as KrF excimer laser (wavelength 248 nm) or ArF excimer laser (wavelength 193 nm), YAG laser harmonic, and i ray from mercury lamp (wavelength 365 nm).

The pattern of the illumination area 2 in the reticle R is illuminated by the exposure light IL and reverse projected at a predetermined rate of magnification $\beta$ (for example, $\beta$ being ¼ or ⅕) by an optical projecting system PL to an exposure area 3 of a four-sided shape on a wafer W coated with a photoresist. It is now assumed that the Z axis extends in parallel to the optical axis AX of the optical projecting system PL. the X axis extends in a non-scanning direction (parallel to the sheet of paper on which FIG. 6 is printed) which is orthogonal to the scanning direction for scanning exposure process on a surface perpendicular to the Z axis, and the Y axis extends in the scanning direction (perpendicular to the sheet of paper of FIG. 6). The reticle R is held on a reticle stage 5A which is driven by a linear motor to continuously travel in the Y direction and minutely turn in the X, Y and rotating directions. The two-dimensional position of the reticle stage 5A is measured with a laser interferometer mounted in a reticle stage driving mechanism 6 and used in conjunction with control data from a main controller system 12, which controls the overall action of the apparatus, by a controller in the reticle stage driving mechanism 6 for controlling the movements of the reticle stage 5A.

The wafer W is placed on a Z tiltable stage 7 as held with a wafer holder not shown. The Z tiltable stage 7 is mounted to an XY stage 9 by three Z actuators 8A to 8C which can extend and retract along the Z direction. The XY stage 9 sits on a stationary table not shown. The Z actuators 8A to 8C may be cam mechanisms for converting the rotating action of a drive motor to vertical movements or an electric deforming device. The Z tiltable stage 7, the Z actuators 8A to 8C, and the XY stage 9 form a wafer stage. Parallel extending and retracting actions of the Z actuators 8A to 8C performed by a focusing controller system 13 including a microprocessor control the focusing position (along the optical axis of the optical projecting system PL or the Z direction) of the Z tiltable stage 7 (the wafer W). By controlling the Z actuators 8A to 8C separately, the tilting angle of the Z tiltable stage 7 (the wafer W) can be determined. Also, the XY stage 9 may be driven by a linear motor to travel continuously in the Y direction and in steps in the X and Y directions. A movable mirror 10m is fixedly mounted to the top of one end of the Z tiltable stage 7 and arranged to which a laser beam is emitted from an external laser interferometer 10.

Figure 9:
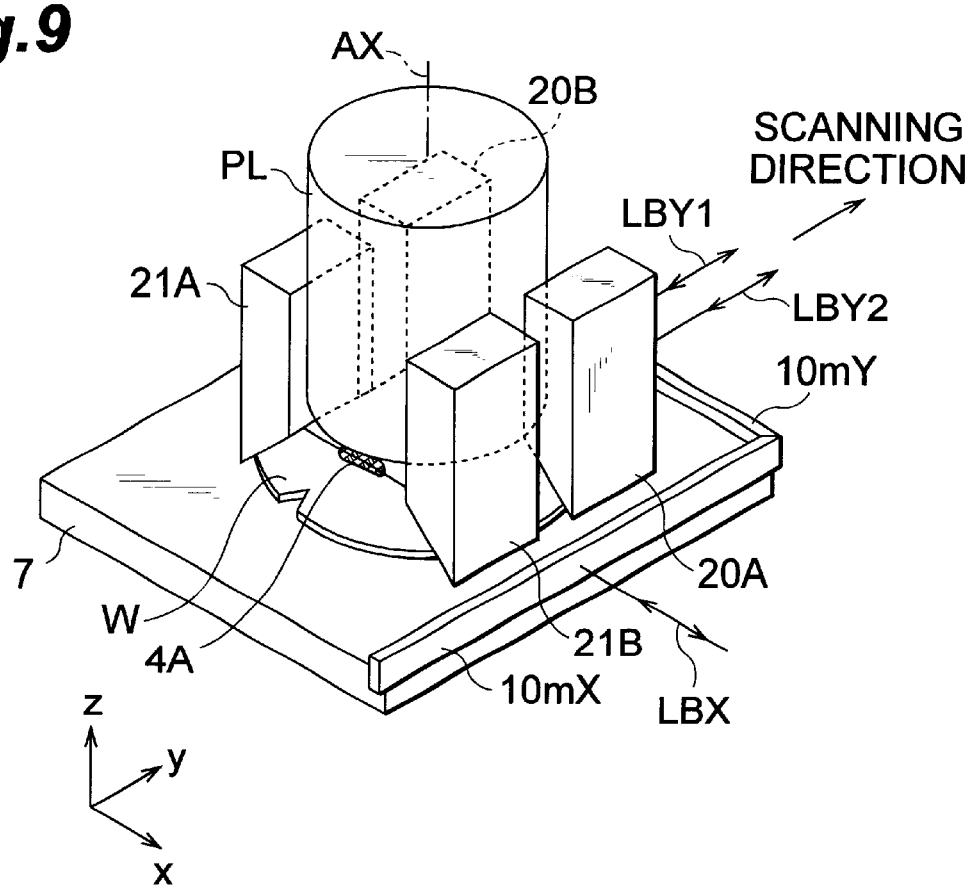
FIG. 9 is a perspective view showing installation of the detecting apparatus of the second embodiment (two AF sensors) in the projection exposure apparatus shown in FIG. 6.

As shown in FIG. 9, the movable mirror 10m comprises an X axis movable mirror 10mX and a Y axis movable mirror 10mY which are orthogonal to each other. One single laser beam LBX is directed in parallel to the X axis to the X axis movable mirror 10mX while two laser beams LBY1 and LBY2 are directed in parallel to the Y axis to the Y axis movable mirror 10mY. For example, the X and Y coordinates on the Z tiltable stage 7 (the wafer W) are measured with the laser beams LBX and LBY1 respectively while the turning angle of the Z tiltable stage 7 (the wafer W) is calculated from a difference between two measurements of the laser beams LBY1 and LBY2.

Returning to FIG. 6, the movement of the XY stage 9 is controlled by a wafer stage driving mechanism 11 responding to the measurements from the laser interferometer 10 and the control data from the main controller system 12. In the scanning exposure process, the reticle R on the reticle stage 5A is scanned over its illumination area 2 at a speed VR in the +Y (or −Y) direction. In synchronism with the reticle scanning, the wafer W on the XY stage 9 is scanned over its exposure area 3 at a speed β·VR (β being the projecting magnification) in the −Y (or +Y) direction. When the scanning exposure to a shot area on the wafer W is completed, the XY stage 9 is stepped to shift the exposure area from one shot area to another before staring the succeeding action of scanning exposure. As this step and scan action is repeated, all the shot areas on the wafer W can be exposed.

During the scanning exposure to the shot areas on the wafer W, the extending and retracting actions of the Z actuators 8A to 8C are controlled by the focusing controller system 13. At the time, it is also necessary to coincide (focus) the surface at the four-sided exposure area 3 of the wafer W with the imaging surface of the optical projecting system PL using the auto-focusing and auto-leveling techniques. Hence, a pair of the AF sensors (focusing position detecting systems) are disposed on both sides of the scanning direction in the optical projecting system PL for feeding the focusing controller system 13 with profile data of the focusing position on the surface of the wafer W.

As shown in FIG. 9, a first AF sensor comprises a projection system 21A and a light collecting system 21B on the −Y direction side of the optical projecting system PL (hereinafter, referred to as AF sensors 21A and 21B) while a second AF sensor comprises a projection system 20A and a light collecting system 20B on the +Y direction side of the optical projecting system PL (referred to as AF sensors 20A and 20B). The first AF sensors 21A and 21B emit a beam of detection light to a pre-reading area 4A on the −Y direction side of the exposure area 3 in the optical projecting system PL and detects the focusing position of a number of measuring spots in the pre-reading area 4A. On the other hand, the second AF sensors 20A and 20B emit a beam of detection light to a pre-reading area 4B (See FIG. 7A) on the +Y direction side of the exposure area 3 in the optical projecting system PL and detects the focusing position of a number of measuring spots in the pre-reading area 4B.

Accordingly, when the exposure area 3 on the wafer W is scanned in the +Y direction, the focusing controller system 13 carries out its controlling action with data of the focusing position in the pre-reading area 4A from the first AF sensors 21A and 21B. When the exposure area 3 on the wafer W is scanned in the −Y direction, the focusing controller system 13 carries out its controlling action with data of the focusing position in the pre-reading area 4B from the second AF sensors 20A and 20B. The two sets of the AF sensors are identical in the construction and the following description for the AF sensor construction and the detection of the focusing position is made with the first AF sensors 21A and 21B.

In the projection system 21A of the first AF sensors 21A and 21B shown in FIG. 6, two illumination sources 22A and 22B emit beams of detection light L1 and L2 respectively which are different in the wavelength, $\lambda_1$ and $\lambda_2$. The two wavelengths $\lambda_1$ and $\lambda_2$ are less optically stimulative to the photoresist of the wafer W. The illumination sources 22A and 22B may be semiconductor lasers, He-Ne lasers, or He-Cd lasers. The use of multi-wavelength detection light (of two or more wavelengths) can control the adverse effects of thin film interference when the surface to be measures is coated with a thin film such as a photoresist layer. The detection beams $L_1$ and $L_2$ are combined to a single axis by a dichroic mirror 23 and directed to a heterodyne beam generation optical system 24.

The heterodyne beam generation optical system 24 includes a plurality of acousto-optic devices which are driven by driving signals supplied from an external driving system 25. Accordingly, two interfering fluxes of light LA1 and LA2 which are differentiated from each other by a frequency difference Δf (for example, Δf being some tens kHz) are generated from the two incident detection beams. Also, the driving system 25 generates a reference beat signal of the frequency Δf by e.g. mixing the driving signals for the two acousto-optic devices and transmits the beat signal to the focusing controller system 13. The two fluxes of light LA1 and LA2 are released at a predetermined intersecting angle from the heterodyne beam generation optical system 24 and intersected each other by a relay system 26 on a grating surface 27a consisted by a joint interface in a reference beam generating prism 27. In FIG. 6, the two fluxes of light LA1 and LA2 and main beams branched from those fluxes are denoted by the real lines.

A diffraction grating (See FIGS. 12A and 12B) is provided in a portion of the grating surface 27a. The diffraction grating allows a positive first-order diffracted light LA1(+1) of the flux of light LA1 and a negative first-order diffracted light LA2(−1) of the flux of light LA2 to be released in parallel from the reference beam generating prism 27. A heterodyne interfering beam consisting of the diffracted lights LA1(+1) and LA2(−1) and having the frequency difference Δf passes through a dithering angle compensating beam generating prism 30 and then enters three light collecting lenses 31A to 31C.

Figure 8:
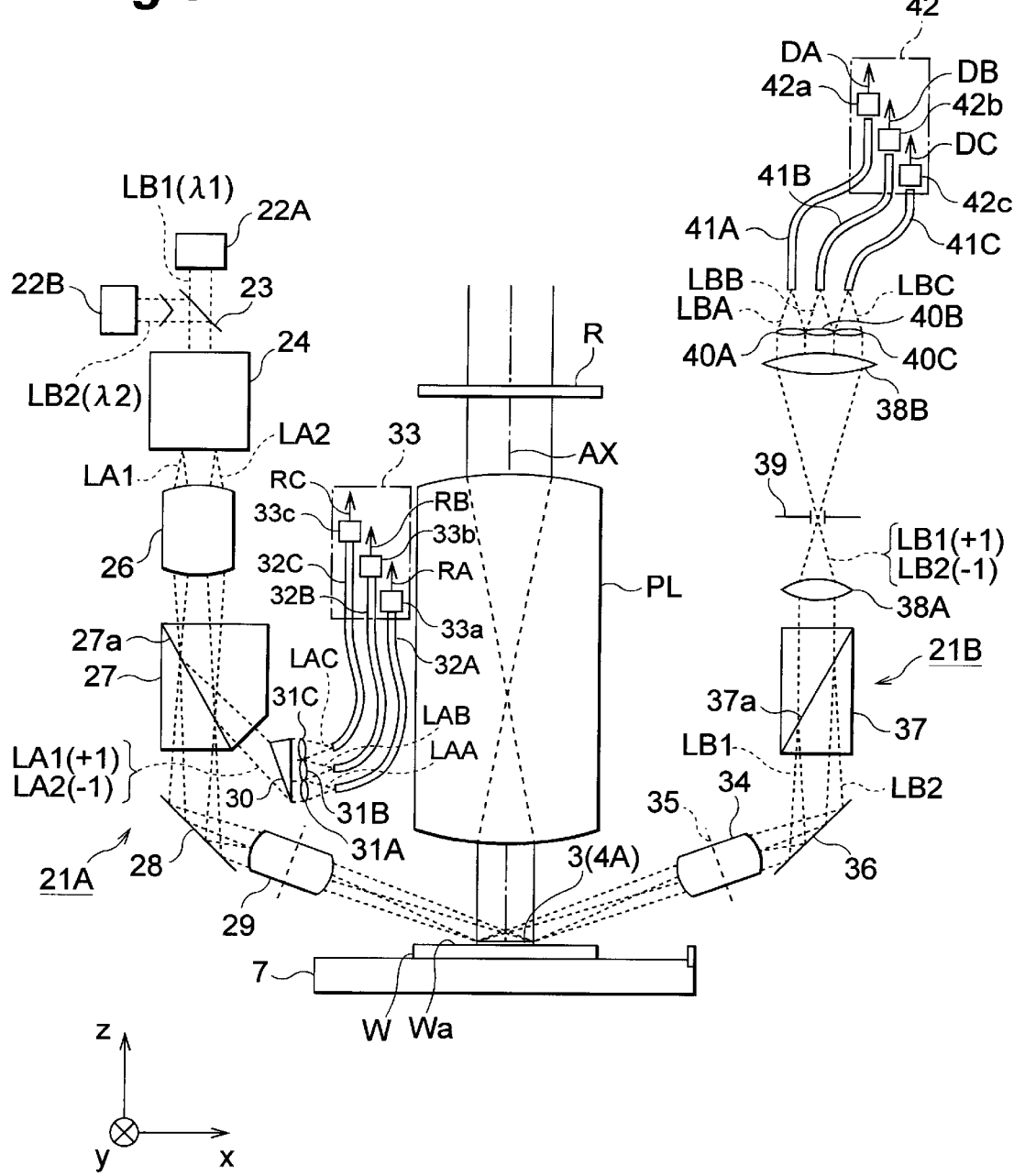
FIG. 8 is a view showing the light path of a detection beam throughout a combination of AF sensors 21A and 21B (the second embodiment of the detecting apparatus) shown in FIG. 6.

The light path denoted by the dotted lines in FIG. 8 indicates a range of the fluxes of light LA1 and LA2 shown in FIG. 6 and their branched fluxes. As shown in FIG. 8, the light collecting lenses 31A to 31C are provided corresponding to three measuring spots in the pre-reading area 4A on the wafer W. The light collecting lenses 31A to 31C pick up interfering lights LAA to LAC from the interfering beam of the diffracted lights LA1(+1) and LA2(−1) and transmit via optical fibers 32A to 32C to three optoelectric detectors 33a to 33c respectively in a reference signal generator 33. The optoelectric detectors 33a to 33c in turn produce reference beat signals RA to RC having the frequency Δf and feed them to the focusing controller system 13 shown in FIG. 6.

Returning to FIG. 6, two flux components (LB1 and LB2) of the fluxes of light LA1 and LA2 entering the reference beam generating prism 27 are passed through the grating surface 27a, reflected on a light path deflecting mirror 28, run via an objective optic 29, and intersected on the pre-reading area 4A in the surface Wa of the wafer W which is the surface to be examined to form a pattern of interference fringes in the pre-reading area 4A. It is noted that the incident angle of the two fluxes LB1 and LB2 from the optical axis is θ. At the time, when the surface Wa coincides with the imaging surface of the optical projecting system PL, it is located conjugate with the grating surface 27a in the reference beam generating prism 27. More particularly, the objective optic 29 satisfies the requirement for shine-proof on the grating surface 27a and the surface Wa (the imaging surface in the optical projecting system PL).

Figure 7A:
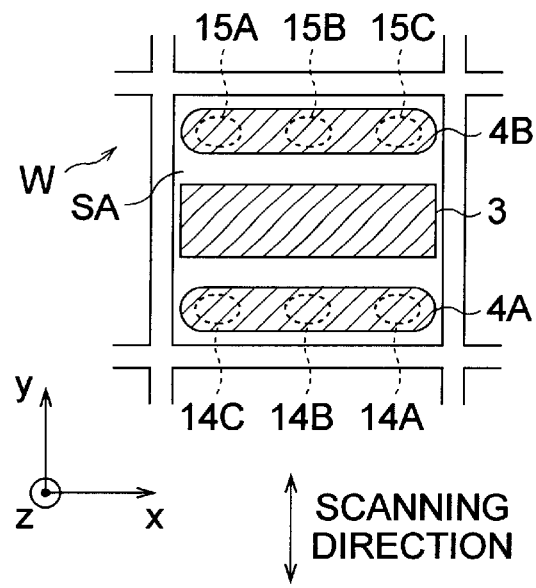
FIG. 7A is an enlarged plane view showing the relationship between an exposure area 3 and a pre-reading area 4A on a wafer and FIG. 7B is an enlarged plane view showing interference fringes in the pre-reading area 4A.

FIG. 7A illustrates the relationship between the exposure area 3' and the pre-reading area 4A. As shown in FIG. 7A, the pre-reading area 4A of a rectangular shape which is denoted by the hatching extends in the X direction and is spaced in the −Y direction from the exposure area 3 which also extends in the X direction in a given shot area SA on the wafer W. As described previously, data of the focusing position in the pre-reading area 4A is used for scanning the exposure area 3 in the shot area SA in the +Y direction. In the second embodiment, three measuring spots 14A to 14C are provided in the pre-reading area 4A as aligned in a row in the X direction for detecting the focusing position separately. The fluxes of light entering the optical fibers 32A to 32C are diffracted on the grating surface 27a at conjugate portions with the measuring spots 14A to 14C respectively. Similarly, while the pre-reading area 4B on the +Y direction side is involved in the scanning of the exposure area 3 in the shot area SA in the −Y direction, three measuring spots 15A to 15C are provided in the pre-reading area 4B as aligned in a row in the X direction for detecting the focusing position separately.

In this embodiment, the two fluxes LB1 and LB2 from the projection system 21A shown in FIG. 6 enter the pre-reading area 4A along the lengthwise direction of the pre-reading area 4A or the X direction. Equally, two fluxes from the projection system 20A shown in FIG. 9 enter the pre-reading area 4B along the lengthwise direction of the pre-reading area 4B or the X direction. Accordingly, the pre-reading areas 4A and 4B including the focusing position measuring spots are located close to the exposure area 3 along the scanning direction thus ensuring the focusing control at a higher accuracy. Also in the second embodiment, the focusing position is detected in the areas spaced from the exposure area 3, whereby even if the operating distance of the optical projecting system PL is as small as less than 1 mm, the light fluxes for detecting the focusing position in the optical projecting system PL can be prevented from being vignetted.

Figure 7B:
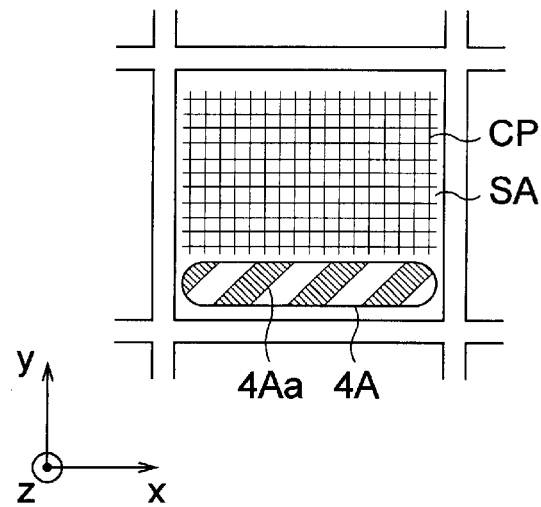

FIG. 7B shows a pattern of interference fringes 4Aa generated by the two fluxes in the pre-reading area 4A. As shown in FIG. 7B, a circuit pattern CP having undulations has been developed in the shot area SA by the preceding steps. The circuit pattern CP comprises commonly a pattern of undulated lines extending in parallel to the sides of the shot area SA. For minimizing the effect of diffraction caused by the circuit pattern CP, the interference fringes 4Aa in the pre-reading area 4A are adapted with its pitch direction (a direction along which the bright and dark bands are rowed) arranged not parallel to the direction of the pattern lines in the circuit pattern CP. For example, the pitch direction in the interference fringes 4Aa may be at an angle of 45 degrees to both the X and Y directions.

Figure 10A:
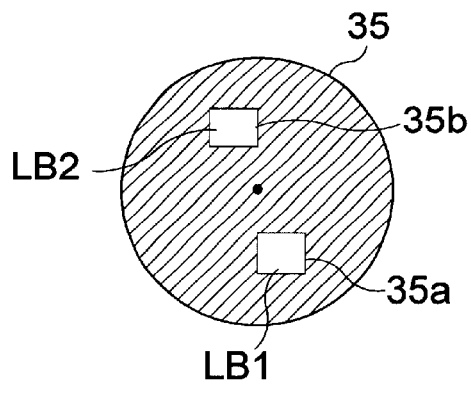
FIG. 10A is a plane view of a spatial filter 35 shown in FIG. 6

Returning to FIG. 6, the two fluxes LB1 and LB2 are reflected on the surface Wa of the wafer W, passed through a detection objective optic 34, deflected by a light path deflecting mirror 36, and incident on a grating surface 37a which is a joint interface in a received beam combining prism 37. While the surface Wa coincides with the imaging surface of the optical projecting system PL, it is set conjugate with the grating surface 37a about the detection objective optic 34. More specifically, the detection objective optic 34 satisfies the requirement for shine-proof (the imaging relation with dithering) on the surface Wa (the imaging surface of the optical projecting system PL) and the grating surface 37a. Also, a spatial filter 35 having two apertures 35a and 35b is provided on the pupil surface (an optical Fourier transform plane) of the detection objective optic 34 opposite to the surface to be examined, as shown in FIG. 10A. The apertures 35a and 35b are located across the paths of the two fluxes LB1 and LB2 respectively which is passed after direct reflected on the surface Wa of the wafer W. The spatial filer 35 blocks the diffracted components which are generated by e.g. the circuit pattern on the surface Wa and cause noises.

Figure 10B:
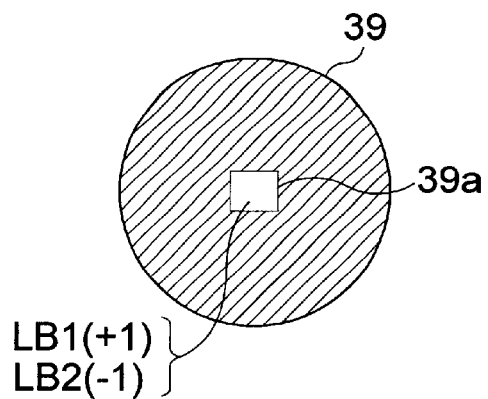
FIG. 10B is a plane view of a spatial filer 39 shown in FIG. 6.

Returning to FIG. 6, another diffraction grating (FIG. 8) is provided in a portion of the grating surface 37a in the received beam combining prism 37 which is conjugate with the pre-reading area 4A. The positive first-order diffracted light LB1(+1) of the flux of light LB1 and the negative first-order diffracted light LB2(−1) of the flux of light LB2 are combined in parallel by the diffraction grating and released from the received beam combining prism 37. They are then passed through a light collecting lens 38A and a spatial filter 39 and collimated by a lens 38B. The spatial filter 39 has an aperture 39a provided therein across the optical axis, as shown in FIG. 10B, for transmitting the positive and negative first-order diffracted lights LB1(+1) and LB2(−1) through the aperture 39a while blocking the remaining diffracted light (including zero-order light).

AS shown in FIG. 8, the heterodyne interference light comprising the diffracted lights LB1(+1) and LB2(−1) is released from the lens 38B and directed to a set of light collecting lenses 40A to 40C. The light collecting lenses 40A to 40C are arranged corresponding to the three measuring spots 14A to 14C (FIG. 7A) in the pre-reading area 4A on the wafer W. Interference lights LBA to LBC separated by their respective light collecting lenses 40A to 40C from the diffracted lights LB1(+1) and LB2(−1) are directed via optical fibers 41A to 41C to optoelectric detectors 42a to 42c respectively in a received light signal generator 42. In response, the optoelectric detectors 42a to 42c produces and release detection beat signals DA to DC of the frequency Δf respectively which are then supplied to the focusing controller system 13 shown in FIG. 6.

The focusing controller system 13 shown in FIG. 6 calculates phase differences φA to φC between the reference beat signals RA to RC from the interference outputs of the optical fibers 32A to 32C and the detection beat signals DA to DC from the interference outputs of the optical fibers 40A to 40C and determines from the differences the average focusing position (in the Z direction) between the measuring spots 14A to 14C shown in FIG. 7A. In the second embodiment, for minimizing the calculation, average defocused amounts ΔZA to ΔZC of the measuring spots 14A to 14C from the imaging surface (the best focused position) of the optical projecting system PL are computed. For the purpose, reference phase differences φA0 to φC0 (which may for example be calculated through a series of test printing processes) between the reference beat signals RA to RC and the detection beat signals DA to DC are produced and recorded in a memory. In an actual exposure action, differences ΔφA to ΔφC between the recorded phase differences φA0 to φC0 and the measured phase differences φA to φC are calculated and then converted to the defocused amounts ΔZA to ΔZC respectively. Then, the extending and retracting movements of the Z actuators 8A to 8C are controlled so that the defocused amounts ΔZA to ΔZC are zero when the surface Wa of the wafer W at the pre-reading area 4A is shifted to the exposure area 3 through the scanning. Both the prereading operation and the focusing action are continuously performed during the scanning exposure process, hence permitting the pattern on the reticle R to be transferred in focus at a high resolution to the shot area to be exposed.

The extending and retracting movements of the Z actuators 8A to 8C until the defocused amounts ΔZA to ΔZC are turned to zero may be replaced by the movement of the imaging surface for offsetting the defocused amounts ΔZA to ΔZC with the use of an imaging surface moving mechanism mounted in the optical projecting system PL which may comprise a device for controlling the pressure of gas between particular lens optics or a device for driving the particular lens optics.

In the above configuration, the differences ΔϕA to ΔϕC between the phase differences correspond to a lateral displacement of the two fluxes LB1 and LB2 from the grating surface 37a of the received beam combining prism 37 which is caused by positional change of the surface Wa of the wafer W in the Z direction. More precisely, assuming that the positional change in the Z direction of the surface Wa of the wafer W shown in FIG. 6 is z, the lateral displacement of the two fluxes LB1 and LB2 from the received beam combining prism 37 is y, the magnification of the detection objective optic 34 from the surface Wa to the grating surface 37a is α, and the incident angle of the two fluxes LB1 and LB2 from the surface Wa is θ, the following equation is established:

$$z = y/(2 \cdot \alpha \cdot \sin \theta) \quad (1)$$

It is apparent from the equation (1) that the detection sensitivity can be improved when the magnification a is increased with the positional change Z (defocused amount) remaining unchanged or when the lateral displacement Y of the two fluxes LB1 and LB2 is increased in proportion to the incident angle θ.

Also, assuming that the lateral displacement of the two fluxes LB1 and LB2 are Y and the pitch in the interference fringes onthe grating surface 37a is p, the phase difference Δϕ(rad) is:

$$\Delta \phi = 2 \cdot \pi \cdot y/p \quad (2)$$

Accordingly, by increasing the detection resolution of the phase difference Δϕ, the lateral displacement Y or the positional change Z in the Z direction from the equation (1) can be obtained at a higher resolution and a higher accuracy.

In the second embodiment, a pattern of interference fringes of the two light fluxes LB1 and LB2 having the frequency difference Δf is formed on the surface Wa of the wafer W which is the surface to be examined and optoelectrically converted via the detection objective optic 34 and the other optics into the detection beat signals DA to DC which are then used for detect the position of the surface to be examined or the focusing position (along the optical axis of the optical projecting system PL). Since the frequency Δf of the detection beat signals DA to DC is preferably some tens kHz, the detection of the focusing position can be executed at as a high speed as within some milliseconds. Also, the phase of the detection beat signal DA to DC is detected as accurate as preferably an order of 10-3rad, hence allowing the detection of the focusing point (a defocused amount) on the surface Wa to be examined at a higher resolution.

Also in the second embodiment, the reference beat signals for producing the detection beat signals DA to DC are optoelectric converted signals of heterodyne interference beams separated by the grating surface 27a in the projection system 21A which is set conjugate with the surface Wa to be examined. Accordingly, while the location of the grating surface 27a relative to the optical projecting system PL is maintained for no dislocation, the defocused amount of the surface Wa from the imaging surface of the optical projecting system PL can be detected precisely and consistently. If the illumination of the illumination sources 22A and 22B is stable, the reference beat signals may electrically be produced from the driving signals used for the acoustooptic elements in the driving system 25. In this case, the reference beam generating prism 27, the beam generating prism 30, the light collecting lenses 31A to 31C, the optical fibers 32A to 32C, and the reference signal generator 33 for generating the reference beat signals are eliminated, thus contributing to the simplification of the overall optical arrangement.

Arrangements of the heterodyne beam generating system 24, the reference beam generating prism 27, and the received beam combining prism 37 shown in FIG. 6 will then be described in more detail.

Figure 11:
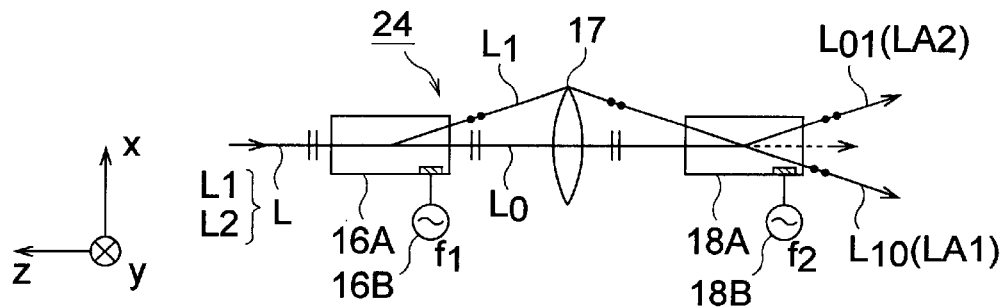
FIG. 11 is a view showing an arrangement of a heterodyne beam generating optical system 24 (a projection optical system) shown in FIG. 6.

FIG. 11 illustrates a construction of the hetaerodyne beam generating optical system 24 where two lights for detection L1 and L2 having different wavelengths are coaxially combined by the dichroic mirror 23 to have a flux of light L. There are aligned along the light path of the light flux L a first acoustooptic element 16A for causing anisotropic Bragg diffraction (referred as anisotropic AOM, hereinafter), a relay lens 17, and a second AOM 18A. The ultrasonic acting areas of the anisotropic AOMs 16A and 18A are conjugate with each other about the relay lens 17. Each of the anisotropic AOMs 16A and 18A is a combination of an acoustooptic medium such as tellurium dioxide ($TeO_2$), silica, quartz, or lead molybdate ($PbMoO_4$) and a transducer such as a piezoelectric device. The transducers of the anisotropic AOMs 16A and 18A are supplied with high-frequency signals of frequencies $f_1$ and $f_2$ ($f_2=f_1+\Delta f$) from a couple of oscillators 16B and 18B respectively. The frequencies $f_1$ and $f_2$ may preferably be a few MHz to some tens MHz for stably driving the AOMs. In practice, the oscillators 16B and 18B are installed in the driving system 25 shown in FIG. 6. More detailed constructions of the anisotropic AOMs 16A and 18A and the principles of anisotropic Bragg diffraction are specified in Japanese Paten Laid-open Publication (Hei)10-50579 (U.S. patent application Ser. No. 08/905,960).

Assuming that the propagating direction of the light flux L is the +Z direction and the X direction extends orthogonal to the Z direction on the surface of paper in FIG. 11, the anisotropic AOMs 16A and 18A in this construction create first-order Bragg diffraction of a component of the light flux polarized in parallel to a surface (the XZ plane) on which both the propagating direction of internal ultrasonic waves and the incident direction of the flux extend while allows a zero-order component to remain unchanged. The polarization of the first-order diffracted light rotates in a direction orthogonal to the incident direction. While the zero-order component is not affected by the frequency modulation, the first-order diffracted component of the incident light is subjected to the frequency modulation at $f_1$ (or $f_2$). Accordingly, the flux of incident light L shown in FIG. 11 is linearly polarized in the X direction.

As a result, the zero-order component of the flux of incident light L entering the first anisotropic AOM 16A is directly passed via the relay lens 17 to the second anisotropic AOM 18A while the first-order diffracted component L1 of the flux L diffracted by the anisotropic AOM 16A is subjected to the modulation at f1, polarized in the direction perpendicular to the surface of the paper in FIG. 11, and then directed via the relay lens 17 to the second anisotropic AOM 18A. In particular, the first anisotropic AOM 16A is adapted having its intensity of ultrasonic waves adjusted so that the zero-order component $L_0$ and the first-order diffracted component $L_1$ are substantially equal in the intensity. This permits the other components of the incident light than the zero-order and first-order diffracted components to be controlled.

On the other hand, the second anisotropic AOM 18A is adapted having its intensity of ultrasonic waves adjusted so that a component of the incident light which is incident in +Z direction and polarized in the direction parallel to the XZ surface is diffracted to be 100% first-order diffracted light. Also, the first-order diffracted component L1 from the first anisotropic AOM 16A is directed to the second anisotropic AOM 18A at such an incident angle that the Bragg diffraction is hardly created. Accordingly, the zero-order component $L_0$ is 100% diffracted by the second anisotropic AOM 18A to be a first-order diffracted light $L_{01}$ modulated at $f_2$ while the first-order diffracted component $L_1$ is directly passed through the second anisotropic AOM 18A and runs as a zero-order light $L_{10}$. The polarization of the first-order diffracted light $L_{01}$ is rotated in the direction perpendicular to the surface of the paper in FIG. 11 by the effect of diffraction in the second anisotropic AOM 18A. So is the polarization of the zero-order light $L_{10}$. Hence, when the first-order diffracted light $L_{01}$ and the zero-order light $L_{10}$ are interfered with each other, a heterodyne beam at a frequency of $|f_1-f_2|$ ($=\Delta f$) is obtained. This allows the zero-order light $L_{10}$ and the first-order diffracted light $L_{01}$ to be used as the fluxes of light LA1 and LA2 respectively shown in FIG. 6.

At the time, the zero-order light $L_{10}$ and the first-order diffracted light $L_{01}$ are diffracted in substantially a symmetric form depending on the pitch of the ultrasonic waves (propagation waves) in the anisotropic AOMs 16A and 18A through the system shown in FIG. 11. Accordingly, if the flux of incident light L is of multi-wavelength such as having two, three, or more wavelengths, the heterodyne interference light output is uniform inthe phase over all the wavelengths. As described with the second embodiment, when such multi-wavelength light is used as the beam of light for detection, the beat signals produced by optoelectric conversion of its interference light has a significant level of S/N ratio (amplitude/DC level) hence ensuring the detection of displacement at a higher accuracy. Also, the two anisotropic AOMs 16A and 18A are employed in the second embodiment, contributing to almost the 100% conversion of the incident light L to the heterodyne beam.

Although the second anisotropic AOM 18A shown in FIG. 11 may release a zero-order component of the zero-order light $L_0$, a spatial filter disposed after the anisotropic AOM 18A can eliminate the zero-order component. In case that the efficiency of converting the incident light L is allowed to be slightly lowered, the two anisotropic AOMs 16A and 18A may be replaced by a combination of an acoustooptic device used in a Raman-Nas diffraction area and an acoustooptic device used in a Bragg diffraction area or a combination of a diffraction grating and two acoustooptic devices used in a Bragg diffraction area.

Figure 12A:
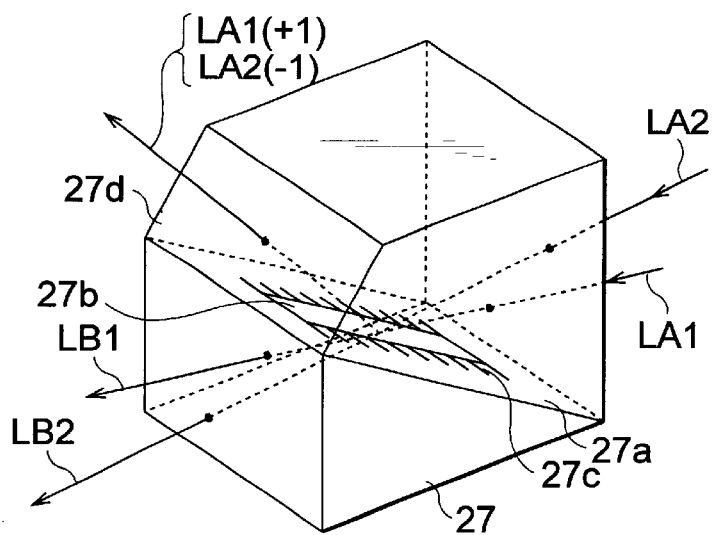
FIG. 12A is an enlarged perspective view of a reference beam generating prism 27 shown in FIG. 6

FIG. 12A illustrates the reference beam generating prism 27 shown in FIG. 6. The reference beam generating prism 27 comprises a prism having a triangle cross section and a prism having a four-sided cross section joined to each other at the grating surface 27a.

Figure 12B:
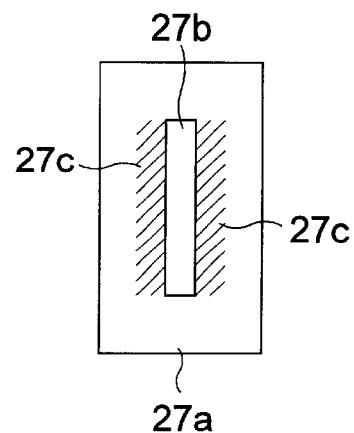
FIG. 12B is a plane view of a grating surface 27a of the prism 27.

As shown in FIG. 12B, a rectangular aperture (transmission slit) 27b is provided in the center of the grating surface 27a and a reference diffraction grating 27c of a reflection type having a particular pitch is formed about the aperture 27b. As described previously, the aperture 27b is set conjugate with the surface Wa of the wafer W about the objective optic 29 shown in FIG. 6. The pitch direction of the reference diffraction grating 27c is tilted so that it extends not parallel to that of the circuit pattern CP shown in FIG. 7B.

The two fluxes of light LA1 and LA2 released from the relay optic 26 shown in FIG. 6 are passed through the incident surface of the reference beam generating prism 27 shown in FIG. 12A and intersected each other at an angle in the aperture 27b and the reference diffraction grating 27c. The direction of interference fringes generated on the reference diffraction grating 27c by intersection of the two light fluxes LA1 and LA2 is parallel to the pitch direction of the reference diffraction grating 27c. A positive first-order diffracted component LA1(+1) of the flux LA1 and a negative first-order diffracted component LA2(−1) of the flux LA2 diffracted by the reference diffraction grating 27c are directed in parallel to each other through an output surface 27d of the prism 27 to the beam generating prism 30 shown in FIG. 6. The pitch of the reference diffraction grating 27c is determined so that the two diffracted components of light LA1(+1) and LA2(−1) are released in parallel to each other. The output surface 27d is set substantially vertical to the propagating direction of the two diffracted components of light LA1(+1) and LA2(−1). The two components LB1 and LB2 of the light fluxes LA1 and LA2 passed through the aperture 27b are directed via the mirror 28 shown in FIG. 6 to the surface to be examined.

Figure 13A:
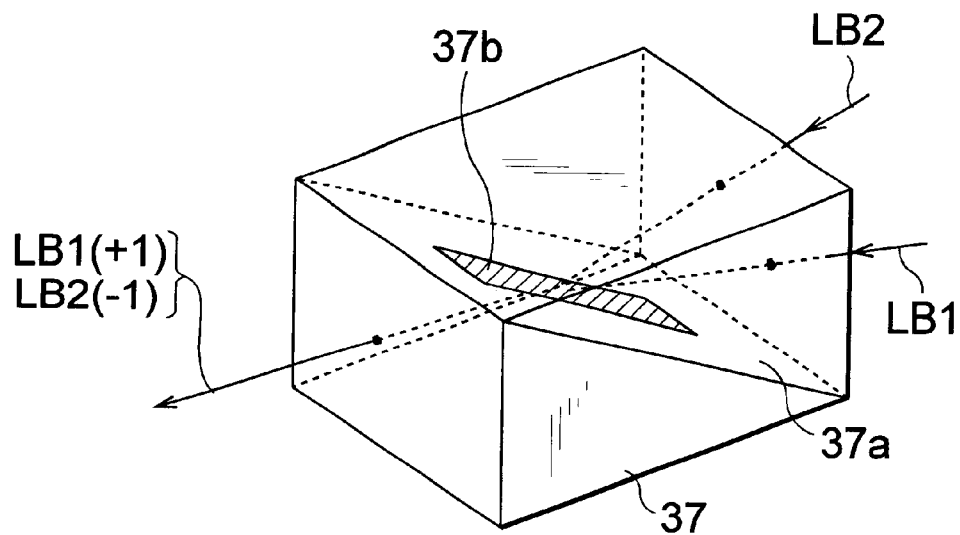
FIG. 13A is an enlarged perspective view of a received beam combining prism 37 shown in FIG. 6
Figure 13B:
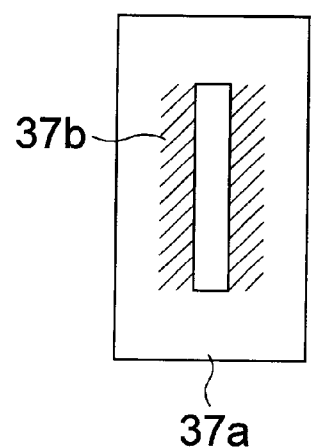
FIG. 13B is a plane view of a grating surface 37a of the prism 37.

FIG. 13A illustrates the received beam combining prism 37 shown in FIG. 6. As shown in FIG. 13A, the received beam combining prism 37 comprises a pair of prisms having a triangle cross section joined to each other at the grating surface 37a acting as a joint interface. The grating surface 37a is set conjugate with the surface Wa of the wafer W which is the surface to be examined about the detection objective optic 34 shown in FIG. 6. Also as shown in FIG. 13B, a diffraction grating 37b having a particular pitch is formed in the center of the grating surface 37a. The pitch direction of the diffraction grating 37b is tilted corresponding to that of the interference fringes 4Aa generated in the pre-reading area 4A shown in FIG. 7B. Accordingly, the two fluxes of light LB1 and LB2 reflected on the mirror 36 shown in FIG. 6 incident at an angle to the received beam combining prism 37 are intersected each other at the diffraction grating 37b so that a positive first-order diffracted component LB1(+1) of the flux LB1 and a negative first-order diffracted component LB2(−1) of the flux LB2 are generated in parallel to each other as a heterodyne interference beam having a frequency difference $\Delta f$ which is then directed to the light collecting lens 38A shown in FIG. 11. For the purpose, the pitch of the diffraction grating 37b is determined so that the two diffracted components of light LB1(+1) and LB2(−1) are released in parallel to each other.

Figure 15:
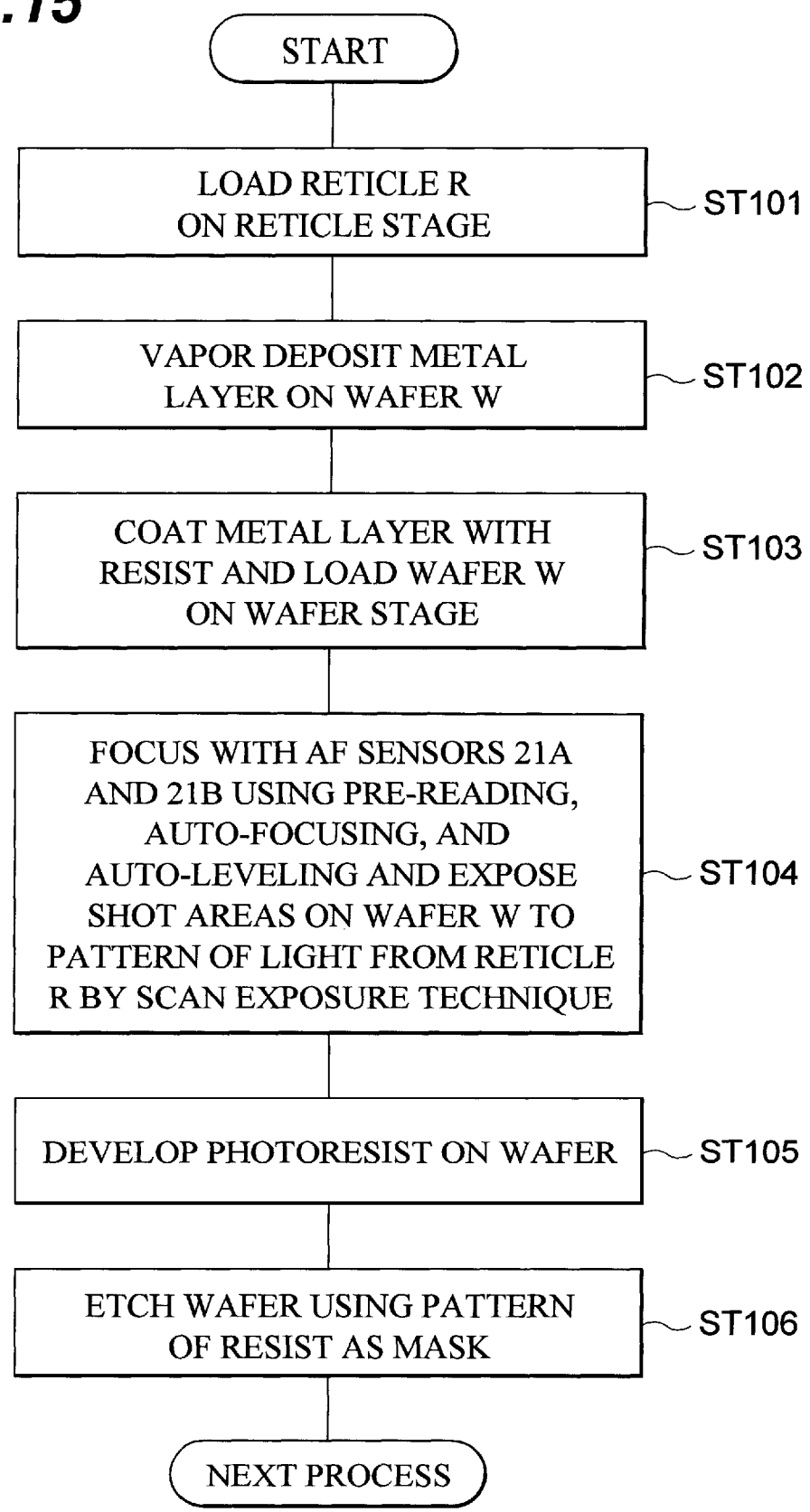
FIG. 15 is a flowchart showing a procedure of steps for producing a circuit pattern on a wafer with the use of a projection exposure apparatus equipped with the detecting apparatus of the second embodiment.

An operation of the projection exposure apparatus equipped with the detecting apparatus of the second embodiment in a process of forming a circuit pattern on the wafer W will now be described referring to a flowchart of FIG. 15. First, at Step ST101 shown in FIG. 15, a reticle R is loaded on the reticle stage 5A shown in FIG. 6. Step ST102 follows where a metal layer is vapor deposited on the wafer (W) to be exposed. At Step ST103, the metal layer on the wafer W is coated with a resist and then the wafer W is loaded on the Z tiltable stage 7 of the wafer stage in the projection exposure apparatus shown in FIG. 6. Step ST104 follows where the auto-focusing and the auto-level focusing are carried out using a combination of the AF sensors 21A and 21B or 20A and 20B shown in FIG. 9 which is selected depending on the scanning direction. In the focusing, a pattern of the reticle R is optically transferred to the shot areas on the wafer W by the scanning exposure method.

This is followed by Step ST105 for development of a resist pattern on the wafer W. At Step ST106, the resist pattern is used as a mask for etching the metal layer on the wafer W. After unwanted portions of the resist pattern are removed, a desired circuit pattern is formed on each shot area on the wafer W. The wafer W is then conveyed to the succeeding process where a circuit pattern of another layer is formed. The AF sensors 21A and 21B of the second embodiment are high in the detection speed hence increasing the responded speed of a series of the steps from pre-reading the focusing position to controlling the posture of the wafer W. This allows the shot areas on the wafer W to be exposed and scanned while they are precisely coincided with the imaging surface of the optical projecting system PL. Accordingly, the transferring of the desired circuit pattern to the shot areas on the wafer W can be performed at a higher resolution.

Although a combination of the illumination sources 22A and 22B and the heterodyne beam generating optical system 24 is used for generating a multi-wavelength heterodyne beam in the second embodiment, a Zeeman laser or the like which can generate two laser beams having a particular frequency difference may be used for the same purpose.

Figure 14A:
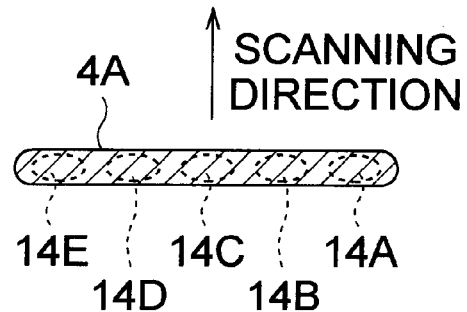
FIG. 14A is a view showing a group of measuring spots in the pre-reading area 4A and FIGS. 14B and 14C are views showing modifications of the detection area in the detecting apparatus of the second embodiment applied to a step-and-repeat type projection exposure apparatus.
Figure 14B:
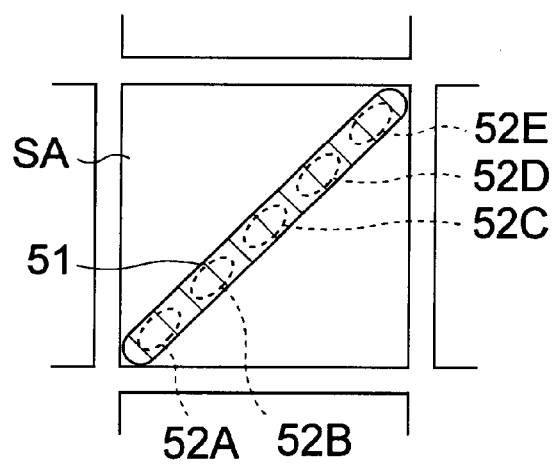

Also, while the focusing position is measured at three spots in the pre-reading areas 4A and 4B in the second embodiment, the number of the measuring spots (points) may be arbitrary. For example, five measuring spots 14A to 14E may be appointed in the pre-reading area 4A for detecting the focusing position, as shown in FIG. 14A. Moreover, two or more rows of measuring slots may be used for detecting the focusing position. When a leveling sensor is provided, the focusing position may be measured at one single spot for example.

Figure 14C:
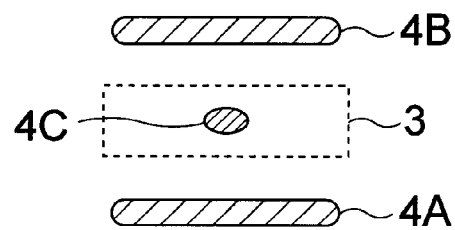

As shown in FIG. 14C, while the focusing position is monitored at one spot 4C in the exposure area 3 in addition to the two pre-reading areas 4A and 4B, the focusing control will be more dependable. The action at the spot 4C is substantially identical to that at the measuring spots 15A in the pre-reading areas 4A and 4B.

The second embodiment is not limited to the step-and-scan type projection exposure apparatus which has been described but can be applied to a step-and-repeat type projection exposure apparatus (a stepper) with equal success. When the present invention is implemented as an AF sensor in the stepper, the heterodyne beam is directed at a specific intersection angle to a detecting area 51 of a slit form in the shot area SA to develop a pattern of interference fringes and the focusing position is measured at five measuring spots 52A to 52E in the detecting area 51.

It is understood that the present invention is not limited to the prescribed embodiments but a variety of modifications will be possible without departing from the scope of the present invention.

Industrial Applicability

As set forth above, the first embodiment of the present invention has optical devices arranged where the power of refraction is different between the lengthwise direction of a slit image re-imaged and the direction orthogonal to the lengthwise direction while the flux of light is converged or dispersed along the lengthwise direction.

This configuration allows information about the optical characteristics of the surface of a substrate, which is contained in the data of the slit pattern re-imaged on the imaging surface of a one-dimensional image pick-up device, to be averaged whereby the effect of non-uniformity of the surface of the substrate will be minimized. Also, in the detection of the position of the surface of the substrate on which a base pattern having a direction is developed, the effect of the base pattern is minimized. Accordingly, the detection of the surface will be performed at both a higher accuracy and a higher speed. Moreover, the overall size of the apparatus will be made compact.

The second embodiment of the present invention provides the detection of the surface with the use of interference between two fluxes of light, hence ensuring the surface detection at a higher accuracy and a higher speed. The second embodiment is less susceptible to aberration in the optics because of using the interference between two fluxes of light, thus contributing to the simplification and the compactness of the optical system arrangement. Moreover, it is easy to increase the resolution in the detection of the phase of heterodyne interference light, whereby the resolution in detecting the surface position will be improved without increasing the optical system for the detection.

The signal detecting system includes two or more optoelectric detectors which handle a plurality of components of light which are split from the interference beam of a beam combining system corresponding to the number of detection areas on the surface to be examined. Accordingly, the position of surfaces at the detection areas can independently be detected from detection signal outputs of the optoelectric devices without increasing the optical system for the detection. Also, a profile of the position of the surfaces at a plurality of measuring spots (an extensive detection area) can easily be calculated.

The received beam combining system having a grating pattern disposed close to a surface conjugate with the surface to be measure for diffracting two fluxes of incident light in one direction can generate a heterodyne beam, which propagates in one direction, from the heterodyne beam received from the surface to be examined and propagating in different directions.

The reference signal generating system is provided for generating reference signals by optoelectric conversion of the interference light between two fluxes of light which are separated from the two fluxes of light received from the projection optics and the position of the surface to be examined is detected by comparing the reference signals with detection signals from the signal detecting system. Accordingly, the detection of the surface position will be performed consistently on the basis of the projection optics.

In addition, the exposure apparatus equipped with the detecting apparatus according to the present invention coincides the surface of a substrate such as a wafer with the imaging surface of the projection system at a higher accuracy and a higher speed. Particularly, in case that the (focusing) position of the surface is pre-read in the projection exposure apparatus of a scanning exposure type such as a step-and-scan type, the detecting apparatus of the present invention provides higher responding actions in the detection thus improving the focusing accuracy.

The method of producing circuitry devices with the exposure apparatus performs the exposure action with the surface of a substrate being best focused, hence ensuring the transferring of a circuit pattern at a higher resolution.

What is claimed is:

1. An apparatus for detecting the position of a surface to be examined along a height direction of the surface orthogonal to the surface, comprising:

a projection optical system for projecting two beams of light which interfere with each other so that they are converged adjacent to the surface to be examined;

a collecting optical system for collecting light reflections of the two beams from the surface;

a received beam combining system for generating a first interference light from the two reflected beams;

a signal detecting system for receiving the first interference light from the received beam combining system and subjecting it to optoelectric conversion; and a control system for detecting the position of the surface along the height direction from a lateral displacement of interference fringes generated by the two reflected beams calculated from detection signals of the signal detecting system and corresponding reference signals.

2. A detecting apparatus according to claim 1, wherein the two beams of light projected from the optical system to the substrate to be examined are different to each other in the frequency.

3. A detecting apparatus according to claim 1, wherein the surface is tiltable relative to an optical axis of the projection optical system and an optical axis of the collecting optical system.

4. A detection apparatus according to claim 1, wherein the received beam combining system includes a grating pattern provided on a plane, which satisfies a requirement of shine-proof with the surface to be examined, for diffracting the two reflected beams in substantially the same direction.

5. A detecting apparatus according to claim 1, wherein a beam combining surface is provided across the light path in the received beam combining system for combining the two reflected beams in substantially one axial direction while a beam splitting surface is provided across the light path in the projection optical system for separating portions of the two reflected beams, and the surface to be examined, the beam combining plane, and the beam splitting surface are located so that a requirement of shine-proof is satisfied between the surface and the beam combining surface and also between the surface and the beam splitting surface.

6. A detecting apparatus according to claim 5 wherein the beam combining surface has a grating pattern for diffracting the two reflected beams in substantially the same direction.

7. A detecting apparatus according to claim 1, wherein the signal detecting system splits the first interference light from the received beam combining system into a plurality of beams corresponding to a number of detection areas on the surface to be examined and is equipped with a plurality of optoelectric detectors for the plurality of the beams while the control system separately detects the position of the detection areas along the height direction of the surface from detection signals of the optoelectric detectors and the corresponding reference signals.

8. A detecting apparatus according to claim 1, further comprising a reference signal generating apparatus for receiving a second interference light generated between two beams split from the two reflected beams and subjecting the second interference light to optoelectric conversion to obtain the corresponding reference signals.

9. A method of detecting the position of a surface to be examined along the height direction of the surface orthogonal to the surface, comprising the steps of:

projecting two beams of light which interfere with each other so that they are converged adjacent to the surface to be examined;

collecting light reflections of the two beams from the surface;

generating a first interference light from the two reflected beams;

optoelectrically converting the first interference light to detection signals containing data about the first interference light; and detecting the position of the surface along the height direction from a lateral displacement of interference fringes generated between the two reflected beams which is calculated from the detection signals and corresponding reference signals.

10. A detecting method according to claim 9, wherein the two beams of light having a frequency difference is projected on the surface to be examined.

11. A detecting method according to claim 9, wherein the two beams of light are projected on the surface to be examined while the surface is tilted.

12. A detecting method according to claim 9, wherein the two reflected beams are diffracted in substantially the same direction by a diffraction grating pattern provided across a surface which satisfies a requirement of shine-proof with the surface to be examined.

13. A detecting method according to claim 9, further comprising:

splitting the first interference light into a plurality of beams corresponding to a number of detection areas on the surface to be examined;

optoelectrically converting the split beams to detection signals containing data about the split beams; and detecting separately the position of the detection areas of the surface along the height direction of the surface from the detection signals and the corresponding reference signals.

14. A detecting method according to claim 9, wherein the corresponding reference signals are generated by optoelectric conversion of a second interference light generated between the two reflected beams.

15. An exposure apparatus comprising:

an optical projecting system for projecting an image of a particular pattern provided in a mask on a substrate;

a substrate stage for adjusting the position of the substrate along an optical axis of the optical projecting system with the substrate placed on the substrate stage;

a mask stage for moving the mask which is being placed on the mask stage;

the detecting apparatus defined in claim 11 for detecting the position of a surface of the substrate along the optical axis of the optical projecting system; and a main control system for driving and controlling the substrate stage in response to data of the position of the surface of the substrate detected by the detecting apparatus so that the surface of the substrate coincides with an imaging surface of the optical projecting system.

16. An exposure apparatus according to claim 15, wherein the main control system drives and controls both the mask stage and the substrate stage along the optical axis of the optical projecting system so that the mask and the substrate are scanned in synchronism about the optical projecting system in the exposure action, directs the detecting apparatus to detect along the optical axis of the optical projecting system the position of a detection area on the substrate which is located in front of an exposure area on the substrate along the scanning direction; and drives and controls the substrate stage in response to results of the detection from the detecting apparatus so that the surface of the substrate and the imaging surface of the optical projecting system coincide with each other.

17. A method of producing an exposure apparatus, comprising the steps of:

providing an optical projecting system for projecting a particular pattern provided in a mask on a substrate;

providing a substrate stage for adjusting the position of the substrate along the optical axis of the optical projecting system with the substrate placed on the substrate stage;

providing a mask stage for moving the mask which is being placed on the mask stage; and providing the detecting apparatus defined in claim 1 for detecting the position of a surface of the substrate along the optical axis of the optical projecting system.

18. A method of producing micro devices with the exposure apparatus defined in claim 15, comprising:

detecting the position of a surface of the substrate placed on the substrate stage along the optical axis of the optical projecting system with the detecting apparatus;

driving and controlling the substrate stage in response to data of the position of the surface of the substrate detected by the detecting apparatus so that the surface of the substrate and the imaging surface of the optical projecting system coincide with each other; and transferring the particular pattern of the mask placed on the mask stage via the optical projecting system to the substrate.

19. An apparatus for detecting positional data of a surface to be examined along a particular direction orthogonal to the surface, comprising:

a first optical system having a first optical axis tilted relative to the surface and arranged for projecting two beams of light, wherein the surface is tiltable; and a second optical system having a second optical axis intersecting the first optical axis and tilted relative to the surface for collecting reflection light of the two beams reflected on the surface.

* * * * *